(12) United States Patent
Slafer

(10) Patent No.: US 9,985,248 B2
(45) Date of Patent: May 29, 2018

(54) METHODS AND SYSTEMS FOR FORMING OLEDS AND THIN FILM DEVICES

(71) Applicant: Microcontinuum, Inc., Cambridge, MA (US)

(72) Inventor: W. Dennis Slafer, Arlington, MA (US)

(73) Assignee: Microcontinuum, Inc., Cambridge, MA (US)

( * ) Notice: Subject to any disclaimer, the term of this patent is extended or adjusted under 35 U.S.C. 154(b) by 0 days. days.

(21) Appl. No.: 15/293,966

(22) Filed: Oct. 14, 2016

(65) Prior Publication Data

US 2017/0110688 A1 Apr. 20, 2017

Related U.S. Application Data

(60) Provisional application No. 62/241,371, filed on Oct. 14, 2015.

(51) Int. Cl.
*H01L 51/52* (2006.01)
*H01L 51/00* (2006.01)

(52) U.S. Cl.
CPC ...... *H01L 51/5262* (2013.01); *H01L 51/0096* (2013.01); *H01L 51/5246* (2013.01)

(58) Field of Classification Search
CPC ............ H01L 51/5262; H01L 51/5246; H01L 51/0096
See application file for complete search history.

(56) References Cited

U.S. PATENT DOCUMENTS

| | | | |
|---|---|---|---|
| 6,686,063 B2 * | 2/2004 | Kobayashi | H01L 51/524 156/67 |
| 8,845,912 B2 * | 9/2014 | Slafer | H01L 51/0023 216/41 |
| 8,940,117 B2 | 1/2015 | Slafer | |
| 9,079,349 B2 | 7/2015 | Slafer | |
| 9,307,648 B2 | 4/2016 | Slafer | |
| 2011/0057222 A1 * | 3/2011 | Hosoda | H01L 51/5262 257/98 |
| 2015/0102007 A1 | 4/2015 | Slafer | |
| 2015/0243829 A1 | 8/2015 | Slafer | |

* cited by examiner

*Primary Examiner* — Tracie Y Green
(74) *Attorney, Agent, or Firm* — McDermott Will & Emery LLP

(57) ABSTRACT

Systems and methods are disclosed for providing working substrates for the deposition of various photonic and electronic devices, in particular for organic light emitting diodes (OLEDs) used for lighting and displays, where these substrates incorporate structural elements that improve the performance of these devices. These elements include nanoscale and microscale relief (3D) patterns on one or both sides of the substrate that are beneficial in controlling light and electrical properties of these devices by, for example, improving light output efficiency and uniformity. The present disclosure describes batch and roll-to-roll (R2R) techniques that allow these performance enhancing substrates to be efficiently formed, and at a much lower cost than can be achieved using prior art. Although one particular application relates to OLED lighting, such substrates can be used to enhance the performance of other devices, including flexible displays, touch screens, energy harvesting cells, sensors, and the like.

23 Claims, 17 Drawing Sheets

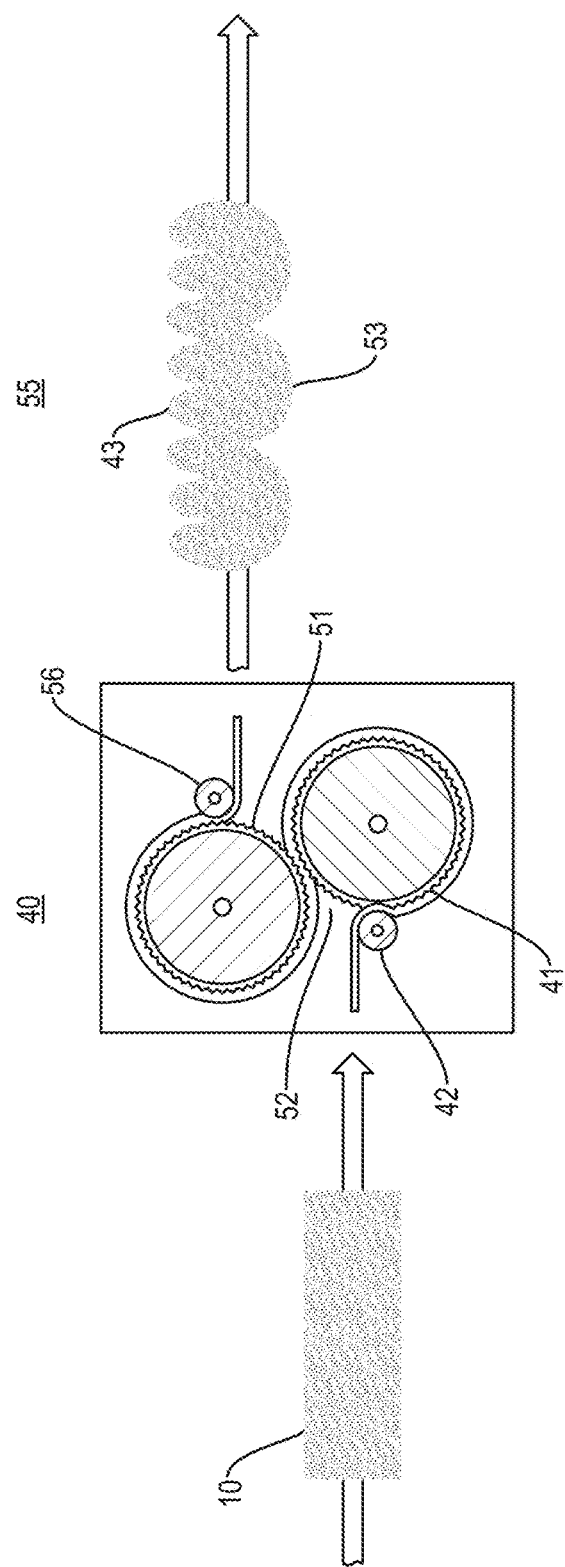

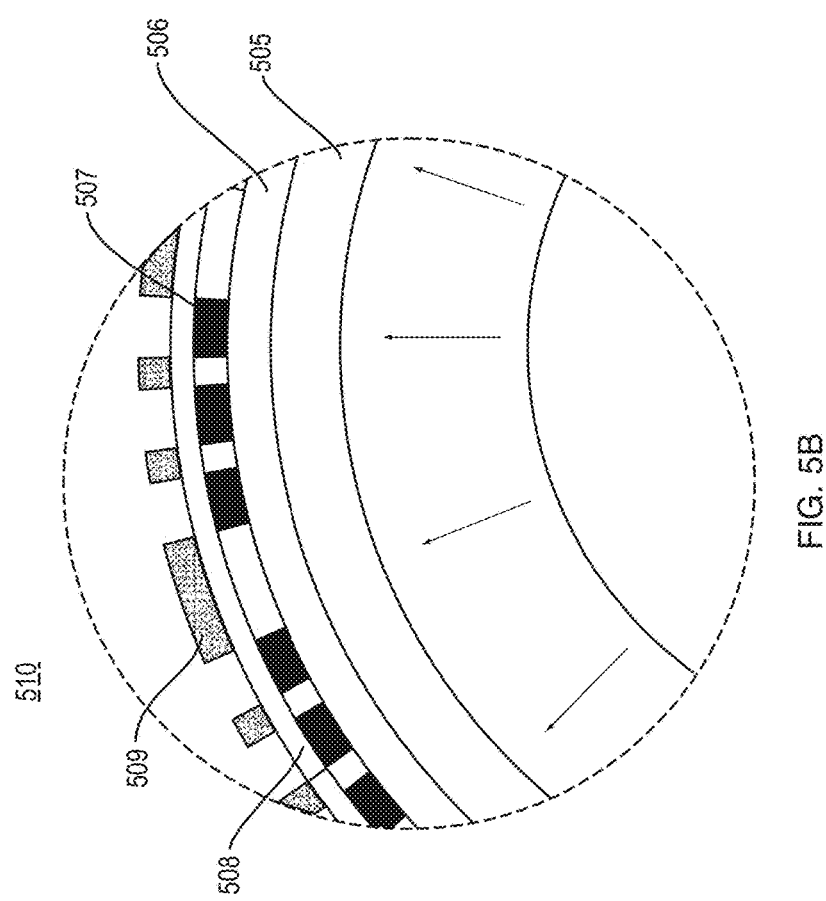
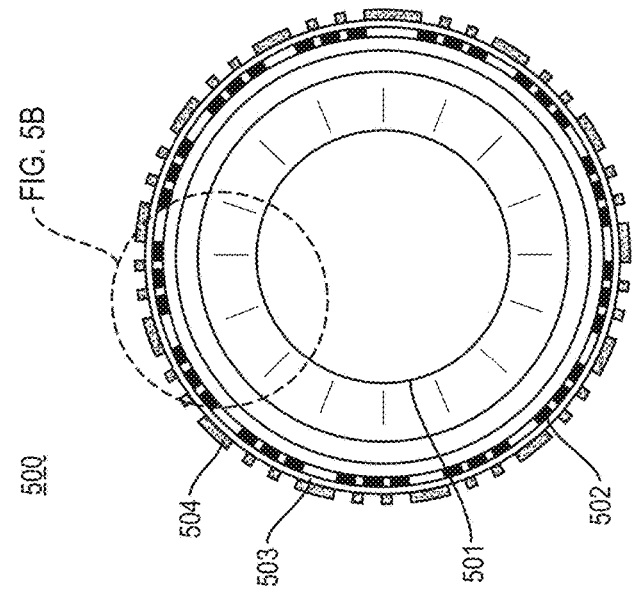
FIG. 5B
FIG. 5A

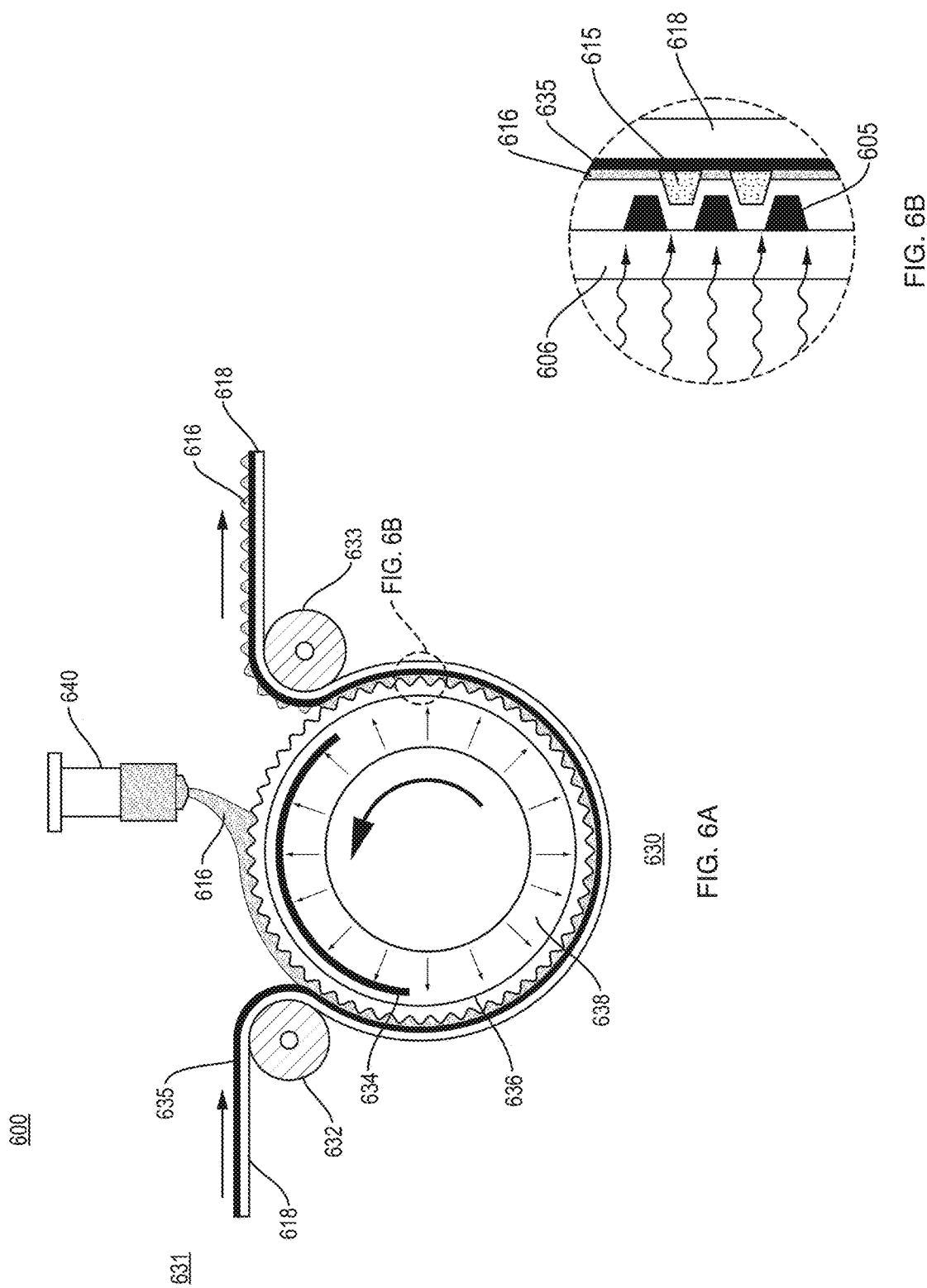

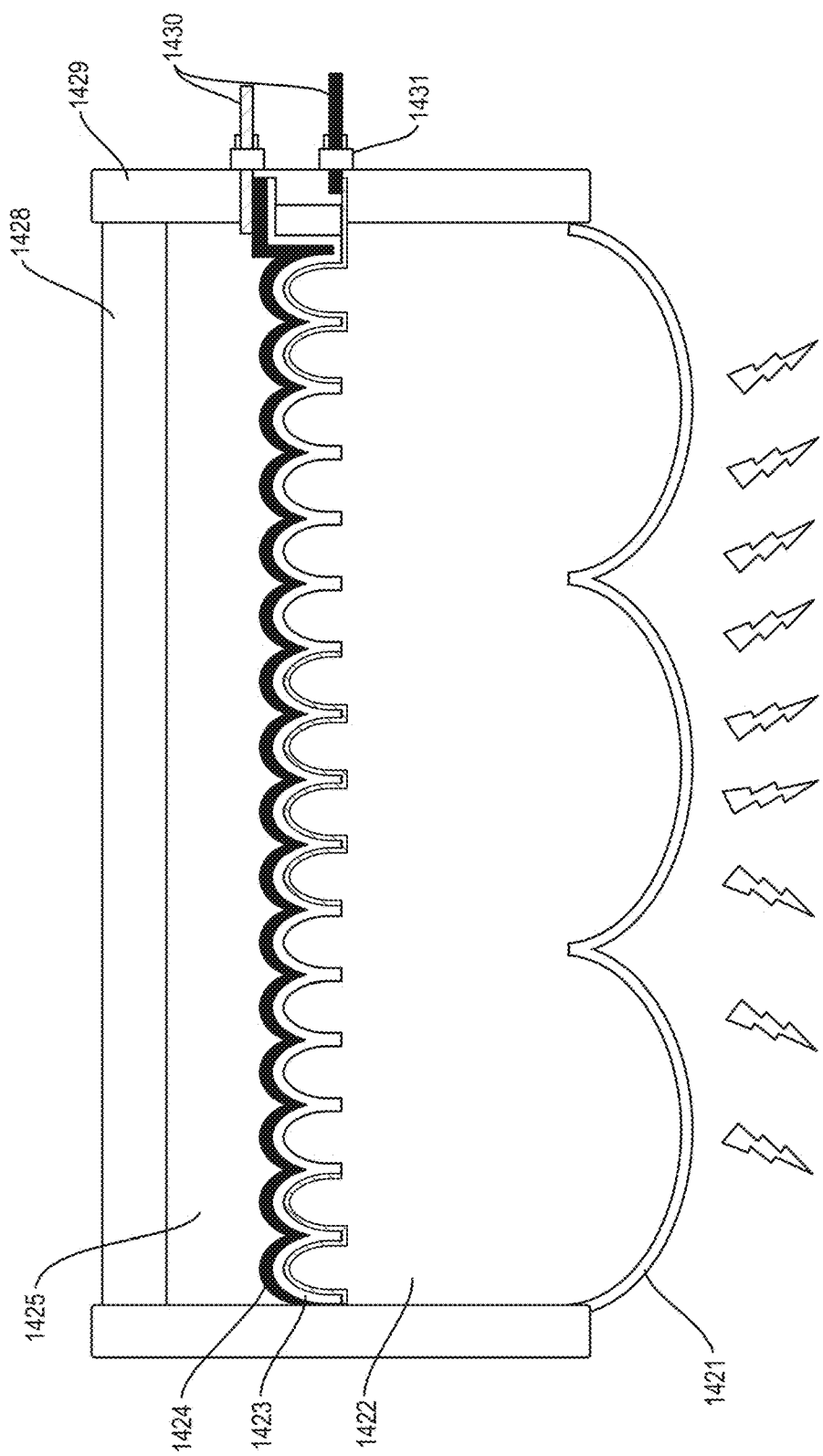

METHODS AND SYSTEMS FOR FORMING OLEDS AND THIN FILM DEVICES

CROSS-REFERENCE TO RELATED APPLICATION

This application is based upon and claims priority to U.S. provisional patent application 62/241,371, entitled "Methods and Systems for Forming Improved OLEDs and Thin Film Devices," filed Oct. 14, 2015; the entire content of which application is incorporated herein by reference.

BACKGROUND

It has been projected that the potential energy savings from energy-efficient solid-state lighting (SSL), i.e., lighting from solid state sources such as light emitting diodes (LEDs), can be very significant: by 2030, the cumulative energy savings due to SSL is estimated to be approximately 1,488 TeraWatt-hours ($120 billion at today's energy prices) while reducing greenhouse gas emission by 246 million metric tons of carbon.

The organic analog of the well-known inorganic LEDs, referred to as OLEDs, are being used to produce ultra-thin and/or curved/bendable televisions, displays, cameras, mobile devices, etc. OLEDs are also being developed for unique applications in lighting, including general, decorative and architectural lighting, signage and advertising, backlighting for displays, automotive and aircraft lighting, etc. OLEDs can be fabricated with a wide range of characteristics to produce unique light sources that are ultrathin, flexible, lightweight, and can cover large areas, etc. OLEDs have the potential to provide a new form of lighting with novel and unique surfaces and shapes.

While the advantages and benefits of OLED lighting are numerous, few such devices are currently available. OLED devices produced by the current technology suffer from a number of limitations, including low light output efficiency, poor light uniformity over large areas, and very critically, very high cost. These limitations inhibit the wide-scale adoption of these devices and the realization of their potential commercial and environmental benefits. Although a number of approaches have been proposed for overcoming these limitations, they are difficult and costly to implement, and often offer minimal performance improvements. The systems and methods disclosed herein overcome a number of key limitations of the prior art.

One major challenge for OLEDs is poor light-extraction efficiency, because much of the light produced in the organic layers is lost due to waveguide trapping due to refractive index mismatching within the multi-layer OLED device stack ("internal light trapping"), and additional light is lost by total internal reflection (TIR) at the substrate/air interface ("external light trapping"). Thus a significant amount of the light generated within an OLED device stack is trapped and lost. Prior art methods for extracting this light, which include use of buckled or undulating surfaces for internal light extraction and microlens arrays and other relief structures for external light extraction, add a high degree of complexity and cost to the manufacturing process, contributing to limited commercial viability for mass-market applications.

Another critical area for OLED devices, as well as to other emissive and light absorbing (photovoltaic and the like) devices, is the transparent electrical conductive ('TC') layer. The most widely used TC materials are transparent conductive oxides, or 'TCO's, including indium tin oxide ('ITO') and related oxides, have a number of drawbacks, including insufficient electrical conductivity, poor optical transmissivity, brittleness, high surface roughness, and tendency for adhesion failure, all of which are exacerbated when TCO's are deposited on flexible plastic substrates. Other transparent conductive materials commonly in current use include organic polymers such as poly(3,4-ethylenedioxythiophene)-poly (styrenesulfonate) (PEDOT: PSS), ultra-thin metal layers, coatings of silver and other nanoparticles (nanotubes, nanowires, nanobuds, etc.), graphene layers, etc. However, as transparent conductor layers these materials all suffer from one or more drawbacks, in particular inadequate electrical conductivity and/or poor optical transmission. Performance tradeoffs typically require sacrifice of optical transmission to achieve higher conductivity, and vice versa. Because OLEDs are current-driven devices, the high resistance of these conductive layers and their inability to handle significant electrical current flux results in emissivity drop off with increasing electrode distance, producing non-uniform light output.

In order to provide adequate electrical conductivity, TCOs such as ITO must be coated very thickly, which in addition to reduced transmission also results in high surface roughness and a tendency to crack and even delaminate from flexible substrates. The resulting surface irregularities produce severe thickness variations in the device stack, such as thinning at sharp external corners of projecting surface structures and pooling at internal corners of depressions, etc. Because OLEDs are extremely sensitive to surface roughness and sharp non-uniformities, these defects are significant sources of poor device performance and device failure.

Another type of transparent conductive layer is the metal grid or mesh, which can offer potentially very high electrical conductivity and optical transmission. Metallic wire grids can be formed by graphic arts printing (ink jet, gravure, flexo, etc.), by electro- or electroless plating, or by vacuum deposition. These techniques produce lines with significant thickness compared to the thickness of the OLED layers coated on them, especially for metallic lines commonly made by printing. In theory, these steps can be eliminated by planarization using typical dielectric planarizing materials, such as polymers, silicon oxides, etc., but this is a problematic process that can easily result in overcoating and thereby insulation the lines. Chemical mechanical polishing (CMP) can be used to planarize such surfaces, but it is not practical for large area devices or for R2R manufacturing. An additional problem with wire grid transparent conductors is the lack of electrical conductivity in the areas between the metal wires. This is not a problem for some grid applications, such as touch screens, but the lack of continuous electrical conductivity over the entire transparent electrode surface does present a problem for OLEDs and other devices (photovoltaic PV, etc.)

As mentioned, one of the most effective extraction structures is formed by periodic or quasi-periodic undulating surfaces, as has been described in recent scientific literature. This approach to light extraction produces other problems, in particular when attempting to combine such an internal light extraction structure with a metal grid. In order to produce best extraction performance from such relief structures, the conductive layer is preferably conformal with the undulating structure—that is, following the contours of the underlying structure. For example, simply combining a (planar) grid with an undulating surface formed over the grid will result in insulation of the grid, since (insulating) polymeric layers are the only viable method for forming such structures. Thus, a means for providing an internal light extraction structure with a high conductivity conformal metal grid, while simultaneously providing a smooth surface for device deposition, and in particular at a commercially viable cost, is currently lacking.

Another important issue for OLEDs and many other organic electronic devices (TFT's, etc.) is extreme sensitivity to moisture and oxygen, which can result in premature device failure for even low levels of such exposure. OLED devices must be carefully protected from these elements, typically through the use of barrier layers and encapsulation sealants, often done by placing the device between glass or glass/metal plates and using epoxy or other oxygen/moisture impermeable sealants to greatly reduce or eliminate ingress of moisture and oxygen. The anode/cathode electrical device connections must also be made through this barrier, further complicating the structure and manufacturing process.

Numerous solutions have been proposed to overcome the described multiple limitations of the prior art, but, as mentioned, all add significantly to the complexity and cost of manufacturing. What is needed is a cost-effective means of incorporating various improvement technologies into these devices.

SUMMARY

Embodiments and aspect of the present disclosure overcome the shortcomings of the prior art by providing methods, apparatus, and systems for forming substrates with structures that enable increased light extraction efficiency, increased light output uniformity and incorporate barrier protection, all while significantly reducing manufacturing costs In one aspect, the present disclosure provides systems and methods for forming substrates for the deposition of OLED, optical, photonic and other such devices, where these substrates incorporate by cost-effective means various structures for extracting trapped light, providing uniform continuous transparent electrical conductivity, providing low roughness surface, and for providing barrier protection. The methods can generally include one or more of the steps of forming 3D extraction patterns on a substrate using polymer replication from a master pattern, forming a conformal continuous transparent conductor comprising a metal grid with a secondary electrical ('field') conductor by vacuum or other means, forming a flexible polymeric mask over the underlying layers with subtractive removal of the metal exposed through the mask openings, and for certain embodiments the intact transfer of a structure from one substrate to another. As used herein, "conformally" refers or equates to "in a manner that follows the contours of an underlying structure or surface"; and "conformal" refers or equates to "following the contours of an underlying structure or surface."

Substrates upon which devices are formed are often referred to as 'working' substrates, or when additional features are incorporated, 'enhanced' or 'integral' substrates, and this usage will be used throughout the descriptions to follow. While embodiments of the present disclosure may be carried out or implemented on either rigid or flexible substrates, the use of flexible substrates combined with the methods of roll-to-roll processing offers the greatest benefit in terms of cost, production throughput, and area, thus roll-to-roll applications will be emphasized in the following descriptions.

As mentioned above, an effectively way to overcome the well-known problem of waveguide light trapping is by the use of undulating or "buckled" or diffractive surfaces that extract trapped light from the multi-layer device stack, and by the use of optical structures such as microlens arrays and moth-eye anti-reflection surfaces for substrate-trapped light.

One aspect of the present disclosure is a method by which relief surfaces for light extraction can be incorporated into the internal and external surfaces of a single or multi-ply substrate to reduce the effects of waveguide and TIR light trapping, respectively. In a preferred embodiment, the substrate is a polymeric film, preferably in the range from 10 to 500 µm in thickness, in which a periodic or quasi-periodic nanopattern having a desired pitch, amplitude and profile is formed on an one substrate surface (for inner extraction), and a concave or convex microlens or moth eye array or other such light extraction structure is formed on the other surface (for external light extraction), where inner and outer refer to the location of the layer with respect to the finished device (the OLED deposition surface being 'inner' and the substrate/air interface being 'outer'), where these structures are formed by the application of the technique of chemical or radiation (e.g., UV) imprinting of the desired patterns onto the surfaces of the film. A high index film such as polycarbonate can be advantageously used because its refractive index (~1.59) more closely matches that of the OLED stack, thereby helping to reduce waveguide reflections at the interface of the substrate and OLED layer. Similarly, a microlens or moth eye antireflection structure formed on the outer film surface reduces the Fresnel reflection at the film-air interface. In this embodiment, the structures for the internal and external light extraction can be formed on either side of a single substrate, or on separate substrates that are subsequently bonded together, including one or more layers or adhesives with barrier properties.

In another embodiment, a commercial oxygen and moisture barrier, such as Vitex TM (Vitex Systems, Inc., San Jose, Calif.) or 3M or other, may be incorporated into the substrate so as to take advantage of the index-matching between the OLED stack and polycarbonate film. Thus, this layer can be applied to the external patterned surface of the film, where a lower refractive index barrier would be selected to better match that of air. Alternatively, the barrier can be applied to the inner relief surface, in which case the refractive index of the barrier would be selected to best match the device stack and the substrate (i.e., typically higher for internal barrier than external barrier).

It is well known that the use of various transparent conductive materials, such as TCOs, organic and nanoparticles mentioned above, for the transparent electrodes for OLEDs, photovoltaic devices and the like, results in limited performance for these devices. It is therefore another aspect of the present disclosure to provide an improved form of transparent conductive layer and fabrication method that uses both a microscale metallic wire mesh (i.e., with lines widths below 50 µm, preferably below 15 µm) and a continuous field conductor. Furthermore, a method of the present disclosure by which the variation in material properties between metal and field conductor are eliminated so as to provide a surface with constant material properties upon which OLEDs and other devices may be deposited. It is yet another aspect of the present disclosure to provide a low-cost method for forming a metal grid plus continuous field conductor that is conformal to the undulating surface. In another embodiment is provided a low-cost method for forming a metal grid plus continuous field conductor that is conformal to the undulating surface without protruding metal or field conductor elements and presenting a surface of uniform material properties to the layers to be deposited upon it; relevant details are further disclosed in co-owned U.S. patent application Ser. No. 14/575,034, entitled "Methods and Systems for Forming Flexible Multilayer Structures" filed Dec. 18, 2014; U.S. patent application Ser. No. 14/281,583, entitled "Tools and Methods for Producing Nanoantenna Electronic Devices," filed May 19, 2014; and U.S. patent application Ser. No. 14/463,069, entitled "Methods for Forming Patterns on Curved Surfaces" filed Aug. 19, 2014.

In yet another embodiment, an enhanced substrate may be formed by combining two or more separate substrates, each with specific features. For example, one film may have formed upon it a nanoarray pattern and metal grid structure, while the other may incorporate an external extraction structure. These separate films may be bonded directly together to form a 2-ply structure (such as by radiation cured adhesive, heat seal adhesive, pressure sensitive adhesive, or the chemical composition of the films permits it, by solvent welding. Alternatively, films containing the internal and external structures can be bonded to a third "core" film. In a particular embodiment, the core film functions as the barrier layer, where the core film includes films with barrier coatings (i.e., that prevent ingress of moisture and oxygen) or an intrinsic barrier substrate (such as Corning flexible "Willow Glass" or other transparent glass or glass-like material).

In a further embodiment, the inner and outer patterns are formed by radiation or thermal imprinting of a polymer layer applied directly onto the core material, or by lamination of such structures formed on a separate film. This has the advantage of allowing each pattern to be formed in a material having the optimum refractive index match for the material that it will contact, thereby minimizing interfacial reflections. For example, the inner pattern can be made from a polymer having a higher index to match that of the conductive OLED layer, and the outer pattern can have a lower index to better match air. One or more core layers can also be used to transition ('grade') the indices from the inner to the outer materials.

By the methods of this disclosure, the polymer mask used to form the metal grid transparent conductor may be made by imprinting or photomask exposure, or a combination of both. These processes generally leave behind unwanted polymer material ('residue' or 'scum layer') with the formed polymer mask. In the case of imprinting, this is solidified (crosslinked) polymer layer at the bottom of the imprinted pattern, and in the photomask case, it is un-crosslinked liquid polymer. Such material is preferably removed in order to reveal the underlying material layer that will be removed in a subsequent etching process. For crosslinked residue material, removal is by plasma etching, which requires vacuum processing. For further reducing costs, it is desirable to eliminate this expensive vacuum etch step, and an alternative method of the present disclosure is to use an essentially planar photomask or an imprint photomask (i.e., semitransparent imprint mask), neither of which produces crosslinked residue, producing instead a liquid residue that can be easily removed by solvent rinse.

In one embodiment that produces a liquid residue, a "2D" photomask is used. This consists of an essentially 2-dimensional layer of transparent and opaque pattern elements on a transparent support. A radiation curable polymeric material is spread between the patterned surface of the 2D photomask and the metallized film to be patterned, and radiation is supplied through the transparent 2D mask support layer to crosslink (cure) only those areas of the polymer layer in contact with the transparent elements of the mask, while the areas in contact with the opaque elements of the mask remain in a liquid state. Placing such a photomask in direct contact with the mask polymer resin can cause damage to the photomask, thus it is an aspect of the present disclosure that a very thin strip sheet is interposed between the 2D mask and the metallized film to protect the 2D mask from mechanical damage (scratching, etc.) and contact with the polymer resin, which could require cleaning of the mask for each exposure. The strip sheet film, preferably but not necessarily, can have a thickness of less than 50 μm and preferably a thickness in the range of approximately 5-15 μm to minimize image spread, and is preferably durable, where these properties are available in films such as PET (polyethylene phthalate), PEN (polyethylene naphthalate) or the like. To eliminate Fresnel reflections from the air gap formed by the 2D mask and the thin strip sheet, a thin layer of index matching fluid (such as isopropyl alcohol or other) is used to wet these two surfaces together. The strip sheet can later be cleaned for reuse.

For R2R processing, an embodiment for forming a polymer mask on a substrate can be realized by incorporating the 2D photomask into the outer surface of a transparent cylindrical sleeve (glass, plastic or other), either by etching of a thin opaque layer (chrome or other) deposited onto the transparent sleeve, or by forming the photomask on a flexible substrate with a release layer such that the photomask layer can be applied, such as a decal, to the transparent cylinder, or preferably by forming the 2D photomask on a flexible transparent film and adhesively bonding the film to the transparent sleeve. This embodiment can offer the advantage of easy removal of the photomask if required by damage or the need to change patterns, similar to flexographic printing masks in the graphic arts industry. The cylinder is mounted in a web transport system in which an unwind spool feeds out a pre-metallized substrate that is brought in contact with the photomask cylinder, such that the metallized surface is facing the photomask cylinder, and after a certain contact time, is the separated from the cylinder and taken up onto a rewind spool. A second unwind spool supplies the thin strip sheet that protects the photomask cylinder, which is interposed between the metallic surface of the pre-metallized substrate and the photomask cylinder, and after a certain area of contact, separated from the cylinder and ultimately taken up onto another rewind spool. In this embodiment, the strip sheet is continuously contacted to the cylinder at a first nip contact station, using an index matching fluid, prior to the second nip station where the metallized film is contacted to the cylinder through the interposed strip sheet. A radiation curable fluid is added at this second nip, between the metallized surface and the strip sheet. Radiation is supplied through the inside of the transparent sleeve through the transparent openings of the photomask and crosslinks the polymer in such areas only. The partially bonded strip sheet-metallized film sandwich is separated from the cylinder at a third nip station. The sandwich can be immediately delaminated or can travel as a laminate to subsequent separation nip, where the peel angle can be adjusted to provide optimal separation of the metallized film (now containing the polymer mask formed by the crosslinked portion of the polymer layer) and the strip sheet containing un-crosslinked polymer. The delamination dynamics (separation angle, speed, etc.) is important in assuring that the polymer mask remains adhered to the metal film. The rewound strip sheet can be optionally transported through a solvent cleaning bath to remove liquid polymer residue for reuse. It should be noted that the use of the strip sheet can eliminate the need to continuously clean the photomask cylinder of uncured polymer resin, as well protecting the photomask surface. Several embodiments of this process are shown schematically in the drawing description section, to follow.

Once the polymeric mask is formed over the metallized substrate, a solvent capable of removing any uncured polymer residue is applied to the substrate, after which the cleaned substrate is dried by air and/or heat. If the polymer residue is crosslinked, it is removed by plasma etching, as is well known to the art. After residue removal, the areas of metal exposed through the openings of the polymer mask are removed, either by wet (chemical) etching or dry (plasma) etching, general methods also well known to the art. After completion of the metal eth step (and any required post etch steps, such as rinsing and drying), the metal pattern is revealed. A final step is mask "liftoff" to remove the polymer mask remaining above the metal lines, which is can be done by chemical or mechanical (e.g., tape stripping) means.

Returning now to the mask formation process, yet another embodiment having the benefit of not requiring plasma etching of the residue layer uses a "3D" imprint photomask, additional details of which are described in the Applicant's co-owned U.S. patent application Ser. No. 13/302,731, entitled "Tools and Methods for Forming Semi-Transparent Patterning Masks," filed Nov. 22, 2011, the entire content of which is incorporated herein by reference. In this patterning tool, the opaque areas of an essentially planar 2D photomask patterning tool are formed with significantly greater thickness than the transparent areas, effectively forming a tool that is both a photomask and an imprint tool. The raised (opaque) areas, which may extend from tens of nm to multiple microns above the transparent surface areas, causes it to perform like an nanoimprint tool, with the advantages of very high patterning resolution (into the nanometer range) which cannot be accomplished with optical patterning without the use of expensive very short wavelength light sources and photomasks. However, for nanoimprinting, the radiation source can emit from either side of the tool for a transparent imprint tool, or from the outer (polymer incident) side for an opaque (Ni or other metal) imprint tool. In the case of the imprint photomask tool, the radiation source is located on the back (i.e., non-imprint) side of the tool so that areas in contact with the clear elements of the mask are crosslinked, while those areas in contact the opaque raised parts of the tool are not exposed. This allows very fine details to be formed, with minimal formation of non-crosslinked residue. This embodiment does not require use of the strip sheet used in the 2D photomask embodiment. Like the 2D photomask cylinder, the imprint-photomask cylinder can be formed directly on the surface of the transparent sleeve, or in the preferred embodiment, as a flexible film that is adhered to the cylinder. Because the amount of uncrosslinked polymer produced by this process is negligible, it may be left on the tool for the next cycle, or lightly cleaned between cycles. Again, the advantage of this embodiment is that it is capable of forming finer features than can be formed using a 2D photomask with common visible (or short-wavelength) radiation.

It is yet another aspect of the present disclosure that the metal film layer (that will become the conductive metal mesh) is deposited onto a substrate having a pre-formed nano- or micropattern, such as a pattern used to facilitate light extraction. In this case, the metal mesh resulting from any of the above patterning processes will be conformal with the underlying pattern for optimal performance of the light extraction layer.

In using 2D a photomask to produce lines and shapes covering a wide range of dimensions, it is difficult to optimally expose large and small features simultaneously. For example, the exposure time required to expose a wide line general will not be optimal for exposing for a narrow line, and vice versa, which, can result, for example, in overexposure of the largest features for optimal exposure of the smallest features, and vice versa. It is a feature of the present disclosure to remedy this situation by placing a secondary 'exposure correction' mask, interposing a negative image relative to the original photomask of different density image wise density over the original photomask. Thus a clear-field photomask is matched with a 'dark field' correction mask. The density of the elements of the correction mask will vary according to the light requirements of the particular features that it overlays. As the requirements can be "non-linear", i.e., narrowest features may require no correction, while the widest one may require significant correction (i.e., reduced transmissivity). Such a correction mask can be made by exposing a photosensitive film through the primary photomask and using non-linear response of the photosensitive film and/or development process to create the correction mask. Alternatively, a stack of correction masks can be used, with each layer designed to produce the optimal density for a particular feature size range. Generally only a few masks will be required to cover a range from a few microns to tens of microns. The correction mask stack is placed inside the cylinder in registration with the 2D photomask pattern, or is laminated to the inside of the 2D mask if a flexible wrap-on photomask film is used.

In applications where electrical conductivity is required over the entire surface of the device (such as OLEDs and PV), a secondary (field) conductor can be utilized. Because the metal grid is highly conductive, the secondary conductor can be used to provide a conductive path to the neatest metal line. If the mesh is, for one example, a hexagonal mesh with a distance between parallel sides of 250 µm, the maximum distance to the neatest conductor is ~125 µm, providing a minimal resistance drop for the circuit. Thus a relatively poor transparent conductor can be used as the field conductor. For the field conductor, any of the previously mentioned transparent conductive materials can be used. However, since the bulk of the electrode conductivity is provided by the metal mesh, thinner or more dilute versions may be used. For example, a much thinner ITO layer than required for a 'stand-alone' ITO TC may be conformally coated over the metal mesh (on a planar or buckled surface) to provide continuous conductivity to the mesh electrode. This offers the benefit of reducing haze with such TCs as silver or carbon nanotubes, which have significant haze component when used to achieve adequate stand-alone electrical conductivity.

Thus three key elements comprise the inner surface of the enhanced substrate: the buckled extraction surface, the conformal metal mesh, and the conformal field conductor. Extraction of light trapped within the substrate by total internal reflection ("external light extraction") requires a texture on the outer surface of the substrate and will be described in a subsequent section.

Regarding the inner elements of the enhanced substrate, a further significant benefit would be to have the metal mesh buried below the surface of the field conductor, with both the field conductor and the metal mesh still being conformal with the buckled extraction surface. The reason for this is as follows: if the metal lines comprising the mesh are 'proud of' (extending from) the surface—be it planar or buckled—then the sharp step that defines the line can cause thin spots (top edges of proud features) and thick spots (bottoms of features) in the deposited layers, especially solution deposited layers. This can produce shorts and non-uniformities in the devices coated on such features. Furthermore, the chemical and mechanical properties of layers coated on metals versus non-metals (oxides, organic layers, polymers, etc.) may be significantly different, resulting in additional device performance issues. It would be desirable to present the deposited layers with a surface that had homogeneous material properties and not abrupt steps or ruts. It is therefore a key embodiment of the present disclosure to form such a surface on an enhanced substrate, and by such means as can be conveniently scaled to large areas, especially as formed by R2R processing. For this embodiment, the buckled extraction surface, the metal mesh and the field conductor are all formed on a temporary "donor" film and subsequently transferred to a "receiving" sheet—the final (working) substrate—intact. In this method, the buckled surface of the donor sheet is the inverse of the desired surface, and an additional material (PTFE, as one example) is conformally coated over this surface to act as a release layer. In inverse order to the previous discussion, the field conductor (ITO, silver nanowires, PEDOT:PSS, etc.) is coated over the release layer, followed by a conformal metal layer. This substrate becomes the input material used to form the metal mesh, by any of the methods described above.

Once the metal mesh is formed on the donor sheet, it is transferred to the receiver sheet by lamination to the receiving film using a radiation curable permanent adhesive (exposed through the transparent receiving substrate). Upon separation of the laminate, the field conductor parts from the buckled surface of the donor sheet at the release layer interface. The radiation cured permanent adhesive precisely retains the (inverse) buckled pattern of the donor surface, with the metal lines embedded into the adhesive and the field conductor conformally covering both the metal and the buckled surface. The resulting structure has no steps from the metal mesh (which can therefore be made as thick as needed for increased conductivity), and being buried under the field conductor presents the uniform chemical and mechanical surface described above to the subsequently deposited layers. This is particularly important in the case of OLED devices, as the layers can be very sensitive to the material to which they are in contact.

A particularly significant aspect of the transfer embodiment is that it enables all of the required layers of the transferred stack, including release, field conductor and metal, to be pre-coated onto the patterned substrate and stockpiled for use in the subsequent patterning and transfer steps. Only a single sequential vacuum coating operation is required to deposit the release layer, a transparent conductive oxide field conductor, and a metal conductive layer, thereby simplifying the process and greatly reducing the overall cost.

Another benefit of the transfer embodiment is that removal of the polymer mask is no longer required. In the non-transfer cases described earlier, the topmost layer of the finished structure is the polymer mask over the metal lines. The polymer mask is an insulator, and relatively thick, and would thus not only prevent electrical contact with the metal lines if not removed, but also would provide very proud features, with the drawbacks previously mentioned, to the subsequently deposited layers. Mask removal can sometimes be problematic in not always cleanly or easily releasing from the metal, whereas in the transfer embodiment, the mask is below the metal, also buried within the permanent transfer adhesive, and does therefore not need to be removed.

It is yet another aspect of the present disclosure to use high index polymers as the surface of the enhanced substrate. This will facilitate light extraction by better matching the high index of the layers of the OLED (etc.) device stack with that of the substrate. This can be accomplished by using a higher index substrate (e.g., polycarbonate, which has a refractive index of 1.59, or other high index polymer film), or using one or more higher index layers to more smoothly transition from the high device index to a lower substrate index. Films such as polycarbonate can be directly imprinted with a buckled extraction structure (as well as an external extraction surface), or a lower index film can be used with an extraction/outcoupling overlayer formed by radiation curing of a high index material. Such materials may consist of a polymer binder with filler of high index nanoparticle (titanium or aluminum oxides, etc.).

If the substrate is a chemically sensitive film, such as polycarbonate, to eliminate the possibility of solvent attach when solvent liftoff is used, a transparent oxide or other barrier layer is vacuum deposited over the chemically sensitive film surface (during same coating operation) to prevent chemical attack, where in the case of a patterned substrate could cause surface deformation. The deposited layer may be chosen to have a refractive between that of the polycarbonate and the OLED layer with which it will later be in contact to further minimize Fresnel reflections at that interface.

It is yet another aspect of the present disclosure to form the internal and external extraction surfaces on the same substrate or on different substrates that are subsequently laminated together. For example, substrates such as polycarbonate or PMMA (polymethyl methacrylate) could be imprinted with the internal pattern on one side and the external pattern in a subsequent imprinting step. This could also be done on two separate substrates in order to eliminate possible physical damage to the one patterned surface or the other surface during processing. The two separate films can be brought together in a final step and adhesively bonded, preferably using a solvent or, where films of different indices are used, an adhesive with a refractive index designed to minimize interfacial reflections.

For many devices, in particular OLEDs, elimination of oxygen and moisture permeation into the device stack is critical for longevity of the device, thus barrier layers are required to protect these devices. For rigid OLED devices, glass is often used in the prior art as a barrier, particularly when transparency is required or desired. For side of the device stack that is not patterned (back side), the barrier can be a flexible glass film (Corning "Willow" glass, etc.), a metal foil (stainless, aluminum, etc.), or a plastic film with a barrier coating. For the enhanced substrate side of the device, this may be incorporated as a layer over the internal (buckled) surface, a layer over the external (microlens) surface, or as an intermediate layer between the two surfaces. While an optimal location for the barrier layer might be as close to the OLED stack as possible, such as conformal with the buckled surface, this would require deposition onto a pre-patterned substrate and would eliminate the possibility of utilizing a commercial product (typically coated on large area planar substrates to minimize cost), and the same is true for placement over the external extraction surface. It is therefore another embodiment of the present disclosure to incorporate into the enhanced substrate a (planar) barrier film, either in the form of a barrier coating on a polymeric film or as a flexible glass or transparent ceramic layer, onto which the buckled surface is formed (for example, by radiation curing of a polymer material with a refractive index optimized for that barrier layer). Alternatively, the barrier layer can be a part of the receiving layer in the case of the transfer embodiment, for example where the permanent transfer adhesive is bonded to the barrier coated side of a barrier film. As another alternative, the barrier film can be incorporated between the enhanced substrate and the external extraction layer, resulting in a 3-ply substrate (external extraction film-barrier film-internal enhanced film). For reduced costs by eliminating one film, the external extraction layer can be formed, using any of the previously mentioned patterning methods, directly onto the outside of the barrier film, resulting in a two-ply enhanced substrate.

In summary, one or more of the embodiments of the present disclosure, as presented above, may be used to form an enhanced substrate having one or more of the following features: internal waveguide extraction structure, conformal metal mesh with conformal field conductor, low-roughness deposition surface, external light extraction structure, and moisture and oxygen barrier layers.

Detailed descriptions of various aspects of the subject technology are given in the following section; additional relevant details are provided in the Applicant's co-owned U.S. patent application Ser. No. 12/358,964, entitled "Roll-to-Roll Patterning of Transparent and Metallic Layers," filed Mar. 23, 2015 and now issued at U.S. Pat. No. 9,307,648 and also U.S. patent application Ser. No. 12/270,650, entitled "Methods and Systems for Forming Flexible Multilayer Structures," filed Nov. 13, 2008, now issued as U.S. Pat. No. 8,940,117; the entire content of all of which patent application and patents are incorporated herein by reference.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 1B illustrates an alternate system and method for forming patterns on both sides of a substrate.

FIGS. 5A-5B show a method and apparatus for exposure compensation in a rotary exposure system using a gray-scale mask.

FIG. 6A-6B illustrate another R2R method and system for forming an etch-free polymer mask on a substrate.

FIG. 14B shows a cross-section of an OLED device deposited onto another substrate incorporating light extraction, transparent metal grid, and barrier layers.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

As stated above, the substrates of the present disclosure may incorporate multiple enhancement features, including a fine undulating surface for extraction of trapped light, an electrically conductive grid, a continuous transparent conductive layer, and on the opposite side of the substrate another undulating pattern for extracting light that is trapped in the substrate. The substrate also includes one or more barrier layers to prevent penetration of oxygen and moisture.

The following diagrams and sketches illustrate certain of the possible embodiments of the present disclosure.

Figure 1A:
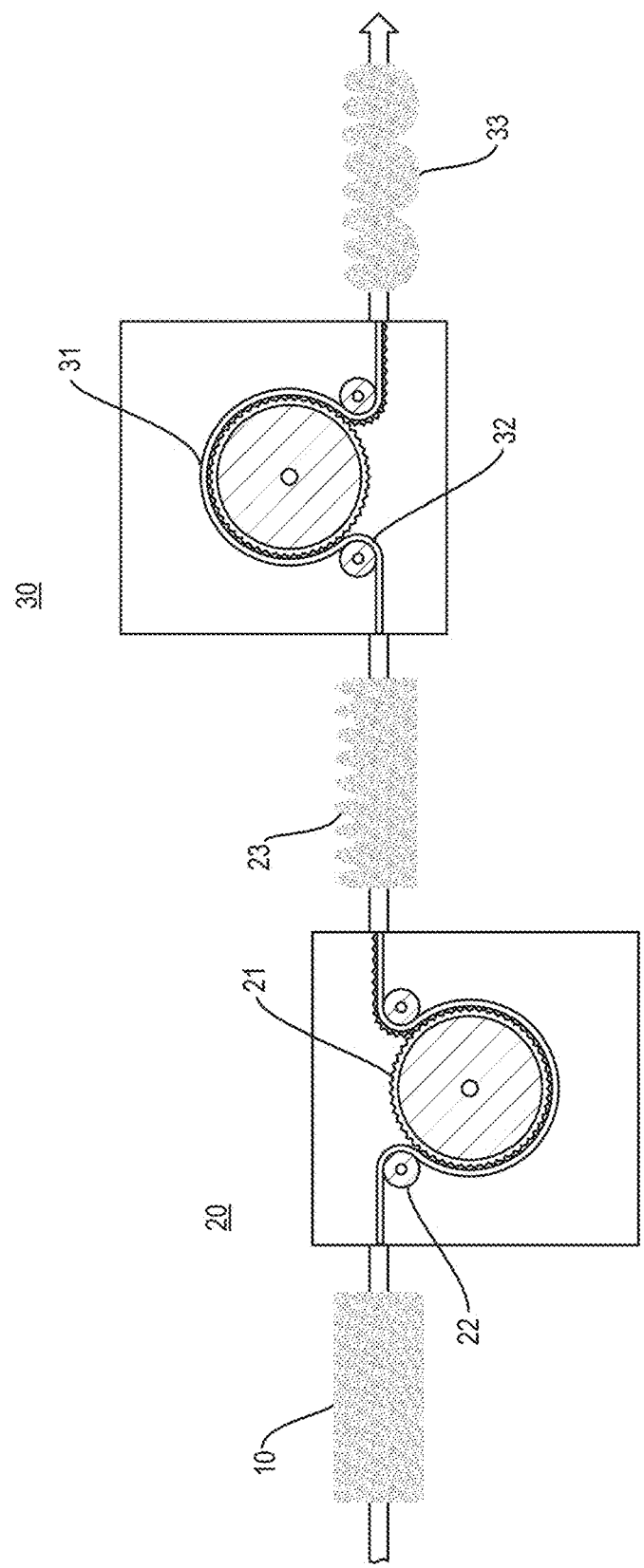
FIG. 1A illustrates a system and method for forming patterns on both sides of a substrate.

The schematic in FIG. 1A illustrates a method for providing a single substrate with both a fine undulating relief pattern for extraction of light trapped in the waveguide mode of a device stack on one surface of a substrate and another relief pattern on the opposite side of the substrate. This can be carried out by any of a number of methods for replicating micro- and nano-scale features known to the art. In this roll-to-roll example, a polycarbonate film substrate 10—chosen for its relatively high refractive index of 1.59, is fed into a first patterning station 20 with patterning cylinder 21 and input nip pressure roll 22, to produce a single sided pattern 23, and subsequently into a second patterning station 30 with patterning cylinder 31 and input pressure nip 32, at which point film 35 is produced, having a relief patterns 23 and 33, of the same or different geometry, on each surface.

FIG. 1B shows an improved method for dual-sided patterning in which patterning station 40 is modified in such a way as to form a first molded surface 43 from cylinder 41 and nip pressure roll 42 and, while the film is still in contact with cylinder 41, is put into contact with cylinder 51 at pressure nip 52, resulting in the formation of dual-patterned film 55 having surface 43 and surface 53. In this case, pressure nip roll 32 in FIG. 1A is eliminated, which would otherwise apply pressure to imprinted surface 23 and possibly cause damage to the relatively delicate surface structure. At nip 52 in FIG. 1B, patterned surface 42 is still in contact with cylinder 41 when pressure is applied to cylinder 51 against cylinder 41 (not shown for clarity), as required to form pattern 53. By this method, no damage is done to surface 43 while surface 53 is being formed. It should be noted that separation nip 56, although a 'face-side' roll for surface 43, may, for preferred embodiments, only be used for separation and may not be required to apply pressure against cylinder 51, thus minimal load is applied to surface 43. Further, roll 56 can include shoulders to eliminate surface contact with surface 43.

The processes illustrated in FIGS. 1A & 1B can be carried out using any number of substrates, including polycarbonate, Zeonor (cyclic olefin), PMMA (polymethyl methacrylate), PET, PEN, polyimide, flexible glass or ceramics.

Figure 2:
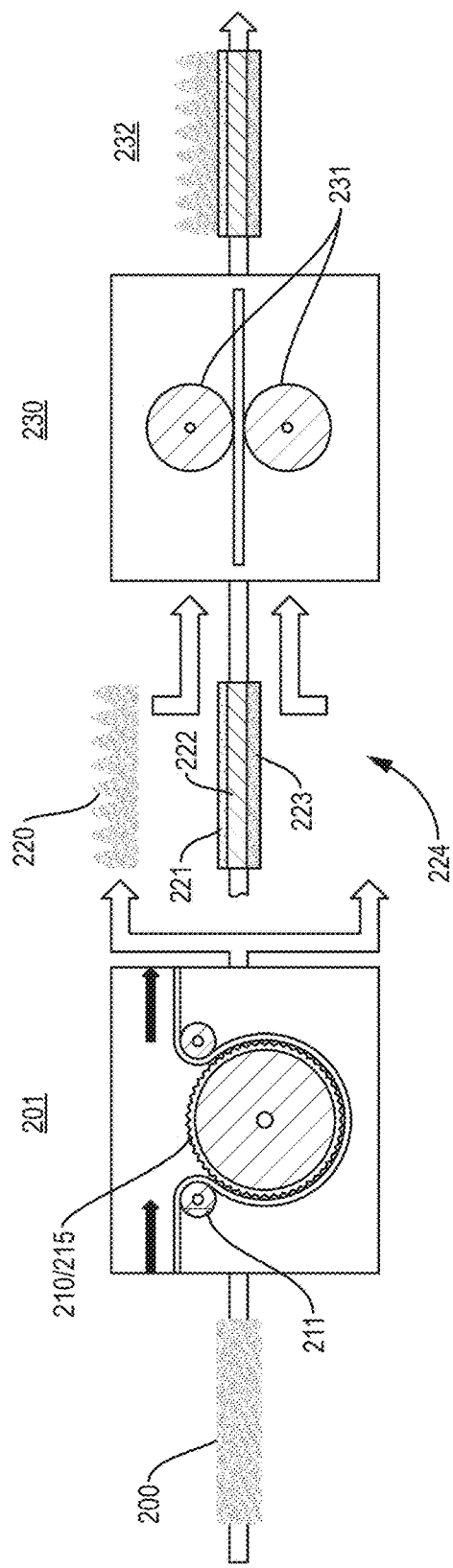
FIG. 2 illustrates a system and method for incorporating a barrier layer in a dual-patterned substrate.

While FIGS. 1A & 1B illustrate methods for dual patterning of a single substrate, FIG. 2 illustrates the formation of a dual patterned substrate comprising 2 or more film layers. Here unpatterned substrate 200 enters into patterning station 201, with patterning cylinders 210 or 215 and input pressure nip roller 211, resulting in the formation of a single sided substrate with pattern 220. Using a different patterning cylinder 215 (or by using a separate machine), another substrate with pattern 224 is formed. Note that substrates with pattern 220 and 224 may be different materials. It may also be desirable to incorporate a barrier layer to prevent oxygen and moisture from attaching subsequently deposited devices, thus film 222, having barrier layer 221 and adhesive layer 223, may be advantageously incorporated as an additional layer to form composite substrate 232, which is accomplished by, for example, passing the multiple substrates through pressure rolls 231 of lamination station 230 using any of the appropriate adhesives known to the art, such as UV-cure, solvent, pressure sensitive (PSA), heat seal, etc.

It should be noted that barrier substrate 222 can be a commercial barrier coat such as Barix TM (made by Vitex Systems, Inc., San Jose, Calif.) or FTB3 Barrier Film (3M) or other such film, or a flexible glass, such as Corning "Willow Glass" or a glass by Schott or other glass manufacturers, or a flexible ceramic (ENrG, Inc.).

The use of multiple films to form the substrate has an advantage that the films and adhesives can be chosen to have a particular refractive index to reduce interfacial reflections. For example, the outer film (onto which the device stack is deposited) might have a high refractive index to better match that of the transparent conductor or thin-film layer to which it is in contact. Further, a substrate bonding adhesive, or stack of adhesives, can have a refractive index (or series of indices in the case of multiple coatings) intermediate to those of the adjacent films, thereby reducing the well-known problem of Fresnel reflections and interfaces with different refractive indices.

Figure 3A:
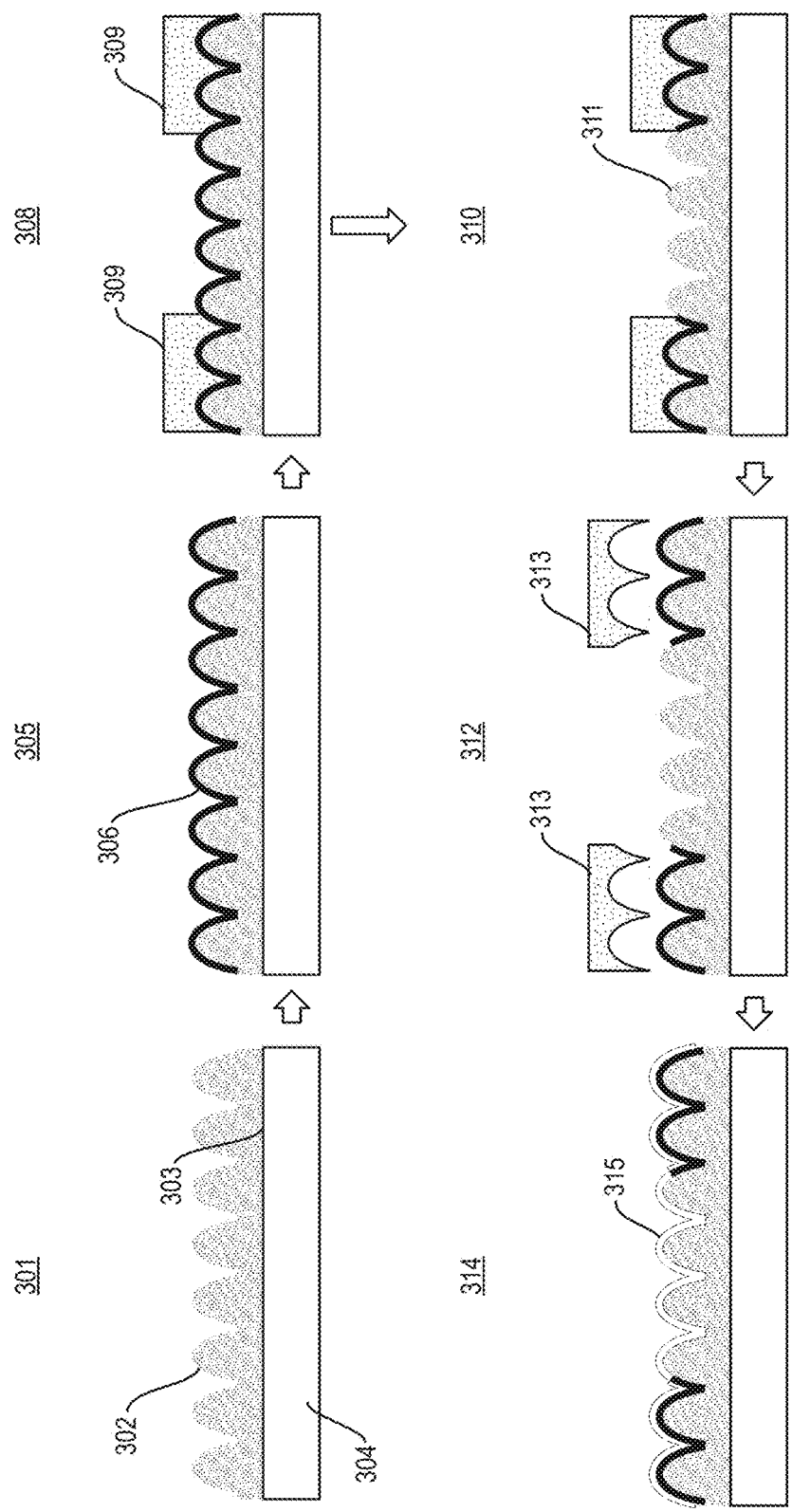
FIG. 3A is a schematic of a method and apparatus for forming a conformal conductive grid and secondary conductor.

In one embodiment of the present disclosure, an electrically conductive grid may be incorporated into the substrate, either on a planar surface or a relief surface. For extraction of trapped light, it is advantageous in terms of efficiency to form the transparent conductive metal grid conformally to the internal relief structure, as shown schematically in FIG. 3A. The series of steps of this method, as illustrated in cross-section, include starting structure 301 with patterned surface 302 shows a single-patterned substrate with internal extraction layer 302 formed on substrate 304. Barrier layer 303 may be included in this structure, as well as in other layers of the structure. Structure 305 shows conductive layer 306 deposited conformally on patterned surface 302. Structure 308 shows elements of the polymer mask 309 after radiation exposure and removal of uncured polymer resin. The areas of conductive layer 306 not covered by mask 309 are removed by etching, such as by wet or plasma means well known to the art, the result of which is shown as area 311 in structure 310. Structure 312 shows removal of 'spent' mask 313, which may be accomplished by chemical, solvent or mechanical liftoff means. This process may be terminated at this step if a conductive pattern, such as a circuit, is desired, or if a continuous transparent conductive film (field conductor) is desired, a final step of forming continuous conformal transparent layer 315 is shown in structure 314. The external light extraction layer used for certain structures has not been shown in FIG. 3A for simplicity. For the conductive grid, metals such as Cu, Al, Ag, Au or any other appropriate metal, as well as transparent conductive inorganic (indium tin oxide or related oxides) or organic materials (PEDOT:PSS, etc.) may be used. In addition, conductive nanoparticles may be used in this application. For the field conductor, any of these same materials, reduced in thickness and density so as to be suitably transparent, may be used.

Figure 3B:
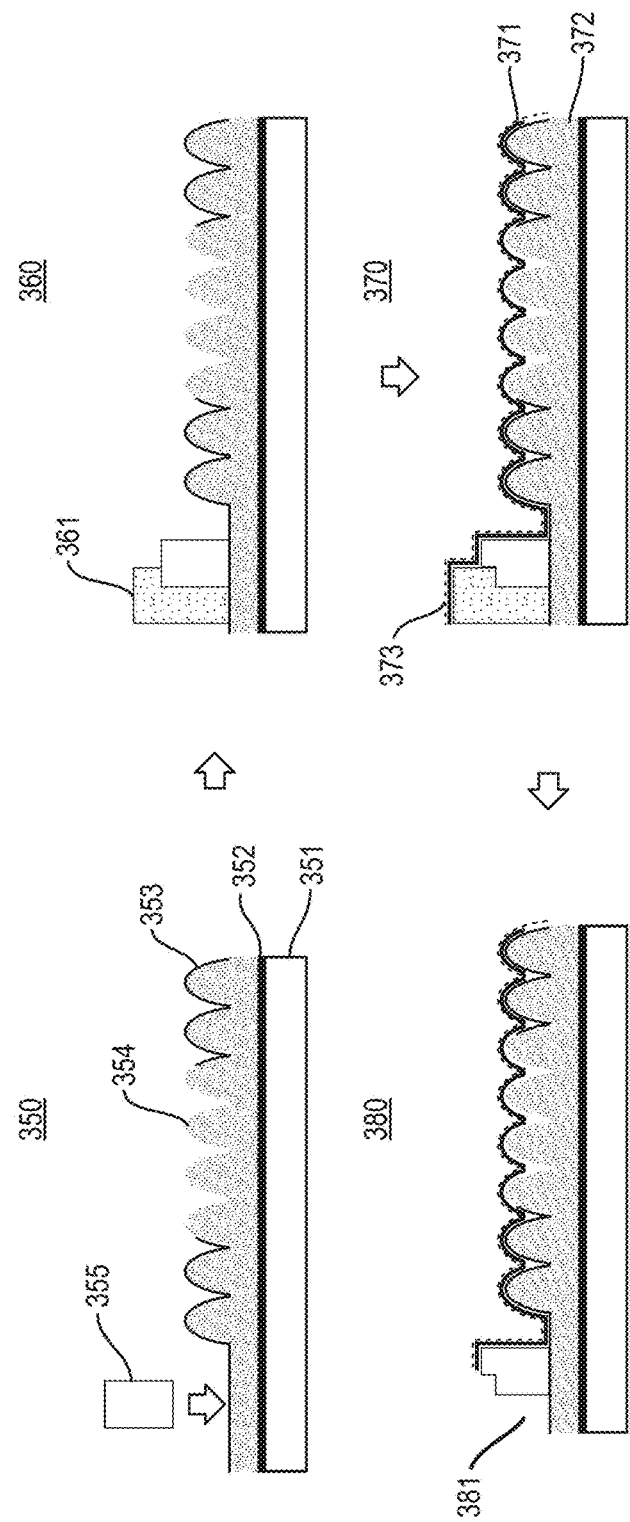
FIG. 3B is a schematic of a method and apparatus for forming electrode contacts.

Yet another aspect of the present disclosure means for making sealed electrical contact to the anode and cathode layers. This method is shown schematically in cross-section in FIG. 3B. After the liftoff of the mask used to form the metal grid pattern (c.f., 312, FIG. 3A), a polymeric insulating patch is formed near the edge of the area that will ultimately define the physical extent of the device. This is shown as 355 in structure 350, which also shows substrate 351, adhesion layer 352, internal relief pattern layer 354, and metal grid area 353. Insulating patch 355 can be formed as an adhesive tape, by silk-screen methods, by ink-jet application of an insulating polymer, etc., so as to leave a portion of the metal exposed for later contact. Temporary mask 361 in structure 360 is applied over this exposed area and over part of insulating patch, the latter coverage designed to prevent shorting between the electrodes. In 370, OLED layers 371 are conformally deposited over metal grid 372, producing structure 373. Temporary mask 361 is now removed, by mechanical separation or other means, thereby exposing the anode metal 381 in 380, and external connections are made to both anode and cathode using known clamping or adhesive means. Having made connections to both electrodes, and edge encapsulant seal is applied around the perimeter of the device to prevent moisture or oxygen from entering the device.

Figure 4:
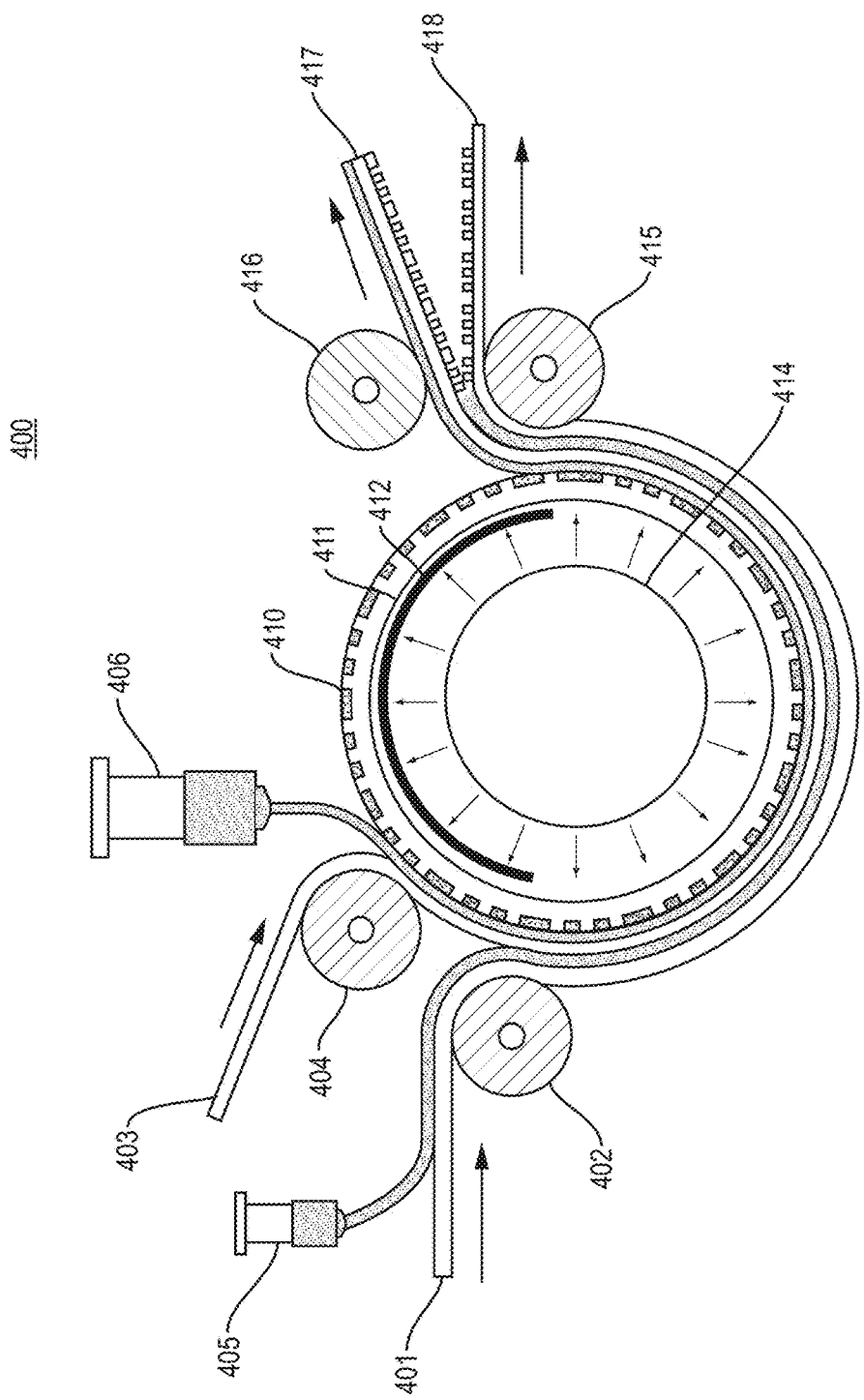
FIG. 4 illustrates a R2R method and system for forming an etch-free polymer mask on a substrate.
Figure 7:
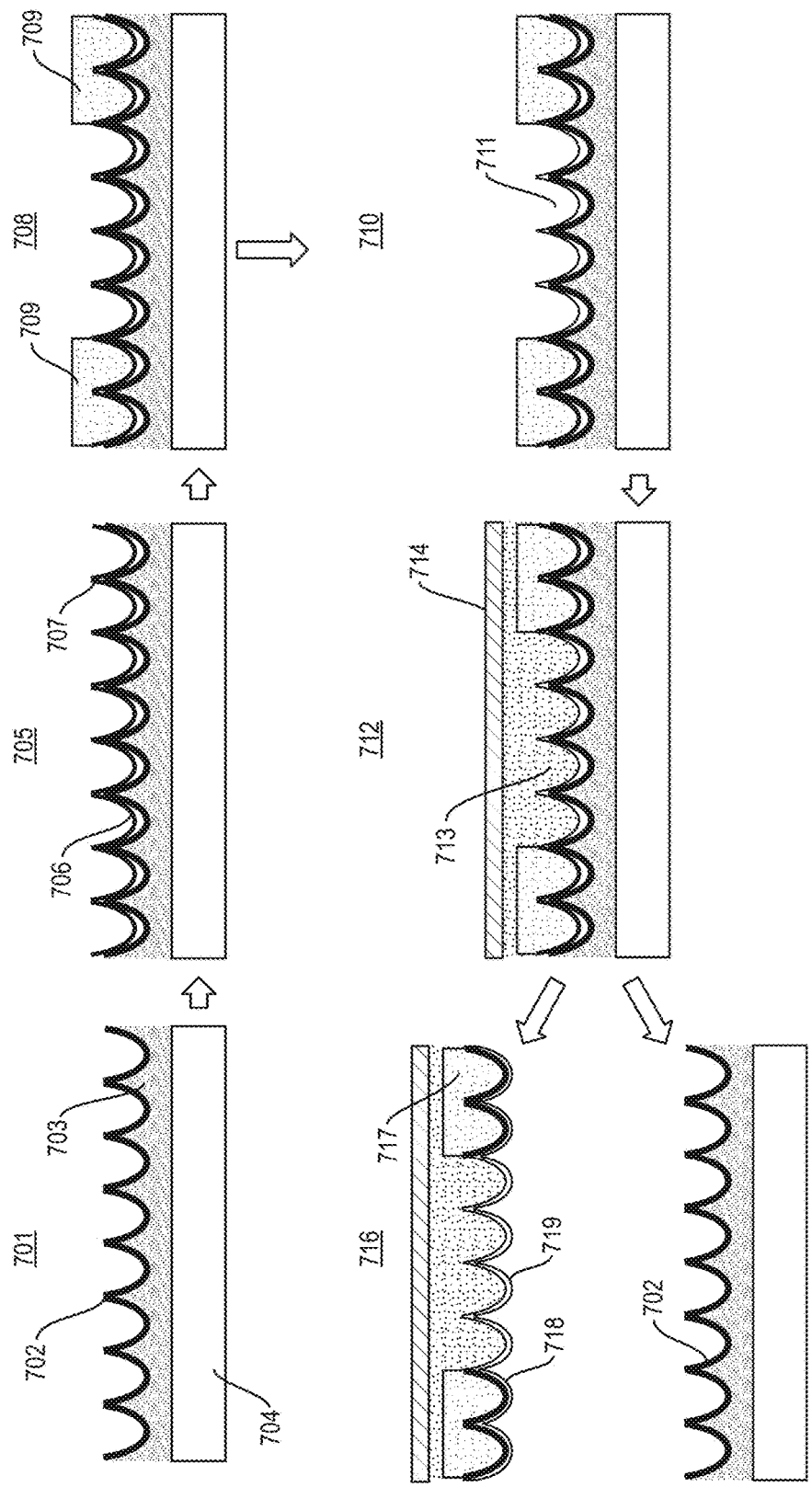
FIG. 7 is a process flow diagram of method steps and apparatus used to form a patterned conductor with a field conductor using a transfer method.

The methods whereby the polymer mask is formed are key embodiments of the present disclosure. One such method is given in FIG. 4, showing a version of a mask forming station 400 for use in a roll-to-roll process. Input substrate 401 is shown here as a simple planar film having a conductive layer (not shown) on the upper surface of the substrate, the completed processing of which would result in a planar conductive grid. However, in applications for which light control functionality is required, such as OLED trapped light extraction, this substrate has additional features underlying the upper conductive layer, as shown in structure 305 (FIG. 3A) or 701 (FIG. 7). In this illustration, substrate 401 is fed into a nip formed by pressure roll 402 and rotary photomask cylinder consisting of photomask pattern 410 formed on the outer surface of transparent cylinder 411. Also fed into contact with the rotary photomask cylinder at pressure roll 404 is strip sheet 403. Index matching fluid 406 is used to eliminate the air gap between film 403 and the drum surface. Radiation curable polymer 405 is used between input substrate 401 and the outside of strip sheet 403. As the rotary drum rotates in a counter clockwise direction, radiation from source 414 travels through the transparent elements of the photomask pattern to cure polymer 405.

It is an aspect of the present disclosure to crosslink (cure) the polymer resin that forms the polymer mask using an array of a solid-state LED diodes operating at a near visible wavelength of approximately 390 nm and to which the polymer resin has been sensitized, although other wavelengths in the visible and UV range can be used. Due to their narrow wavelength output, these sources are advantageous in that they produce virtually no emission at wavelengths that are not useful for curing, thereby producing minimum wasted energy, especially in the form of IR radiation that is characteristic of conventional UV radiation sources. By significantly reducing the heat load deposited into the photomask and substrate, thermal expansion/contraction cycling is eliminated, prolonging the life of the production tools. In addition, solid-state LED sources at this wavelength do not produce ozone or visually damaging wavelengths, both of which are beneficial to machine operators. All of these factors contribute to increased operational efficiency, safety and environmental impact.

Continuing with FIG. 4, substrate 401 and strip sheet 403 now travel together around the drum together and separate from the drum at the nip formed by roller 415 and roller 416, where they are subsequently delaminated into substrate 418, having a polymer photomask formed on the conductive surface of substrate 401, and strip sheet 417, having uncured liquid polymer on its inner surface. Also illustrated is light shield 412, which keeps stray light away from polymer 405 and input nip 402. Film 418 travels to a solvent rinse station for removal of any residual polymer (not shown), and strip sheet 417, containing uncured polymer, is wound up (not shown). It is another aspect of the present disclosure that the polymer and substrate surfaces be selected such that adhesion of the cured polymer be significantly higher to the conductive layer than to the strip sheet surface, while adhesion of the liquid polymer to the strip sheet be higher than to the conductive film in order to cause most of the uncured polymer to wind up with the strip sheet and minimize the amount of solvent cleaning of the working substrate.

In exposing a photosensitive medium through a photomask, it has been found that the exposure flux may require adjustment depending upon the size of the transparent element of the photomask. Thus, for example, very narrow lines may require a somewhat higher radiation flux than wider lines. FIG. 5A-5B show a method of the present disclosure to selectively compensate for this phenomenon when exposing a polymer layer to form a polymer mask using a rotary photomask in a R2R process. A rotary photomask tool with aperture compensation is shown in 500, where internal radiation source 501 emits radiation through density compensation mask 502, through transparent support 503, and finally through photomask 504. Another embodiment of this method is shown in enlargement 510, where in this case transparent sleeve 505 (e.g., glass, quartz or plastic) supports compensation mask 507 formed on transparent support 506 and appropriately registered to the pattern of outer photomask 509 formed on transparent support 508.

FIG. 6A-6B illustrate yet another embodiment of the present disclosure, here directed toward a R2R process for forming a polymer mask on a conductive layer of a substrate. It should be again noted that the substrate may also have an underlying relief pattern and other layers (release, transparent conductor, etc.) which are not shown in this illustration. Here substrate 631 having conductive upper layer 635 deposited on substrate 618 is fed into rotary patterning drum assembly 630, which is comprised of radiation source 638, radiation blocking shield 634, transparent sleeve 636, and opaque relief pattern 605 on transparent support 606. Radiation sensitive polymer resin 616 is dispensed from reservoir 640 onto the surface of the semi-transparent imprint drum 630 where it comes in contact with conductive surface 635 of substrate 631. Counterclockwise rotation of the cylinder moves the film to position, during which time radiation from source 638 causes crosslinking of the polymer adjacent to the transparent aperture elements of the cylinder. The substrate is separated from the drum over exit nip roll 633, producing crosslinked pattern 615 on conductive layer 635 of substrate 618. Any residual polymer, shown as 616 on film surface 635 or on drum surface 605, may be subsequently removed by solvent washing, as is any remaining (not shown for clarity).

Another embodiment of this disclosure illustrates the method for forming a 'buried' conductive grid having an outer surface "flush" with the surrounding surface using a 'transfer' process. This 'step-less' structure is shown in FIG. 7, where structure 701 shows in cross-section an initial substrate with a relief pattern, in this case being the inverse of the structures used in previous examples, for example structure 301 of FIG. 3A. Structure 701 is a "donor" (temporary support) sheet that includes release layer 702 for subsequently allowing overlying layers to be separated from underlying pattern 703. Materials such as PTFE (polytetrafluoroethylene) or other low surface energy material may be used for this layer, where vacuum sputter can be used to deposit such materials in thin, uniform layers. Structure 705 shows this structure after subsequent transparent conductor layer 706 and been formed over 702, which in turn is followed by conductive layer 707, which in this example will be a metal but could be other conductive materials. Structure 708 shows polymer mask 709 formed on metal layer 707, and structure 710 shows some metal from layer 707 has been selectively removed (by etching) from open area 711 to form the conductive grid. Note that the steps of removing residual uncured polymer resin and the subsequent etching of metal layer 707 are not shown for brevity. In 712, "receiving sheet" 714 is laminated to the structure 710 by adhesive 713, and in the last step, structure 716 is formed by the separation of donor sheet 701 from the patterned, conformal metal grid and field conductor. Note that release layer 702 is intact after separation, allowing this substrate to be re-used for additional cost savings while minimizing environmental impact.

Figure 8:
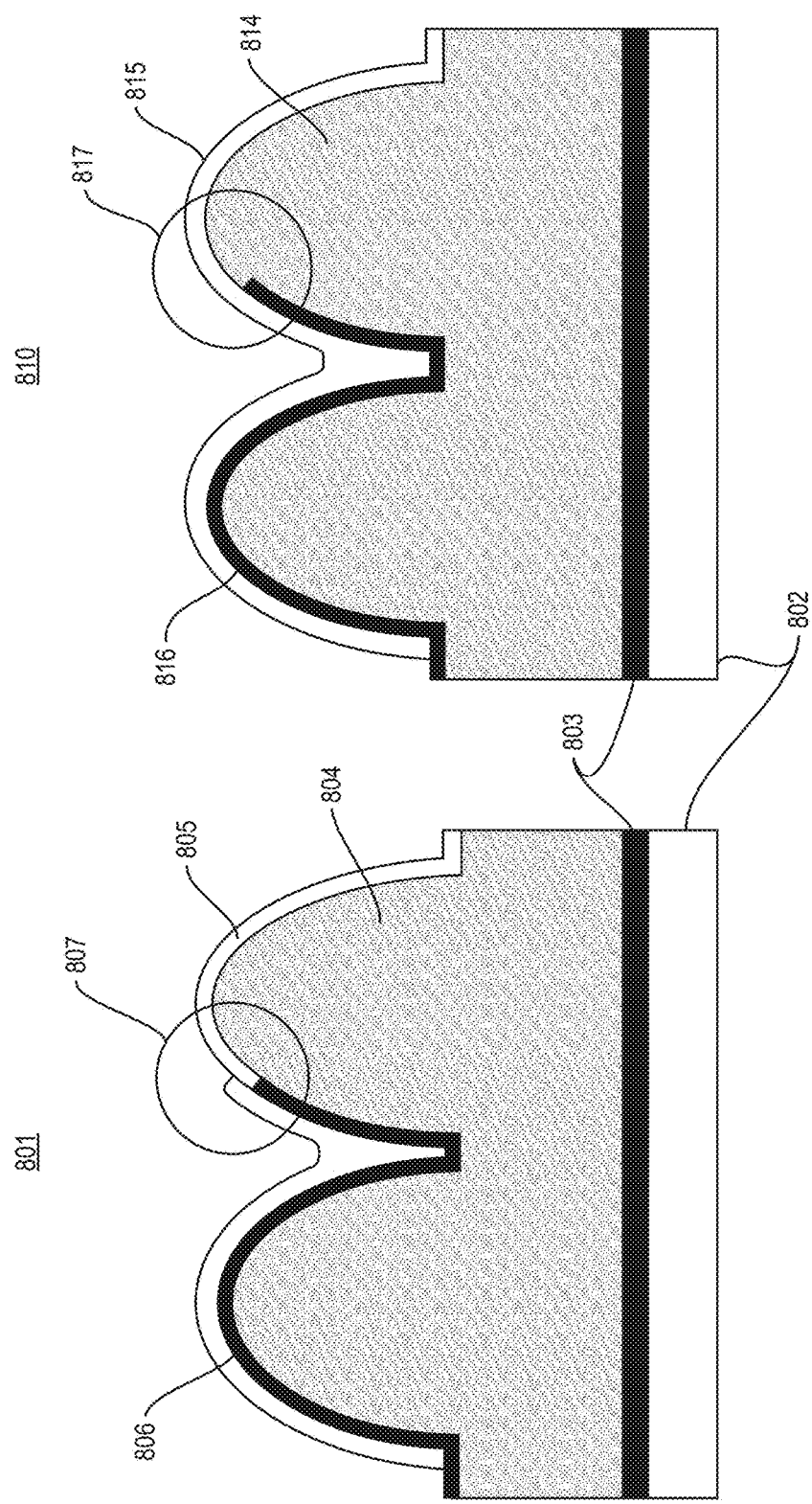
FIG. 8 is a cross-sectional diagram comparing metal grid and field conductor structures made by the direct deposition and transfer method showing "step-less" field conductor integration.

One significant feature of the method described in FIG. 7 is that the metal conductor does not rise above its surrounding surface, creating a step-less structure. This is more precisely shown in FIG. 8, which compares the result of the 'direct' patterning process described in FIGS. 3A-3B and that of the current example. Here cross-sectional structure 801 shows the result of the direct conformal patterning process (FIGS. 3A-3B), while 810 shows the result of the transfer process (FIG. 8). While both structures have the same substrate 802 and barrier coat 803, molded relief polymer 804 of the direct process is slightly different than relief polymer 814 of the transfer process, where in area 807 a step can be seen in field conductor 805 and metal 806 resulting from the conformal coating of metal layer 806 before etching, whereas in area 817 of the transfer process, field conductor 815 is truly conformal with both metal grid 816 and molded polymer relief pattern 814 as a result of metal grid 816 being embedded in polymer layer 814 during transfer.

Figure 9:
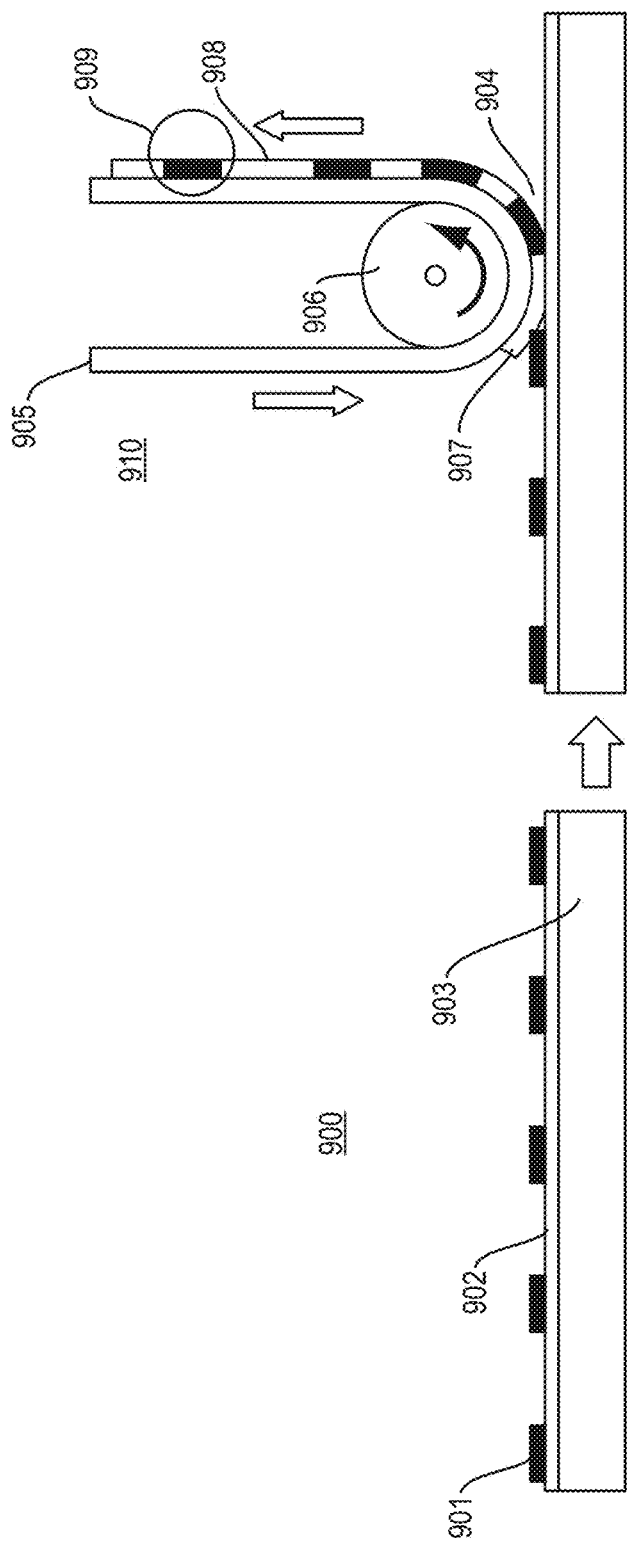
FIG. 9 shows a process and apparatus for forming a planarized metal grid.

A continuous R2R version of the transfer embodiment is shown schematically in sketch FIG. 9, where structure 900 includes donor substrate 903, release layer 902, and metal grid element 901. Note that although this example illustrates an embodiment of the present disclosure for planar substrates, it can also be carried out in a similar fashion using a substrate having a relief pattern. In area 910, receiving substrate 905 is fed from an unwind spool (not shown) into contact with structure 900 using nip roll 906. Adhesive fluid 907 is fed into the roller contact area ('nip'), and after curing (method not shown, but radiation, thermal or chemical activation, etc., can be used. Metal grid elements 901 are embedded in solidified layer 908 and are separated from release layer 902 at separation zone 904. It can be seen at area 909 that the metal grid elements are flush with the solidified adhesive 908 and furthermore have an outer surface that replicates the structure of substrate 903 and release layer 902. As such release layers are generally very thin (tens of nanometers in thickness), the surface of the receiving layer generally replicates the substrate surface. For a very planar film (such as PET, etc.), this provides a very smooth surface for subsequent processing.

Figure 10:
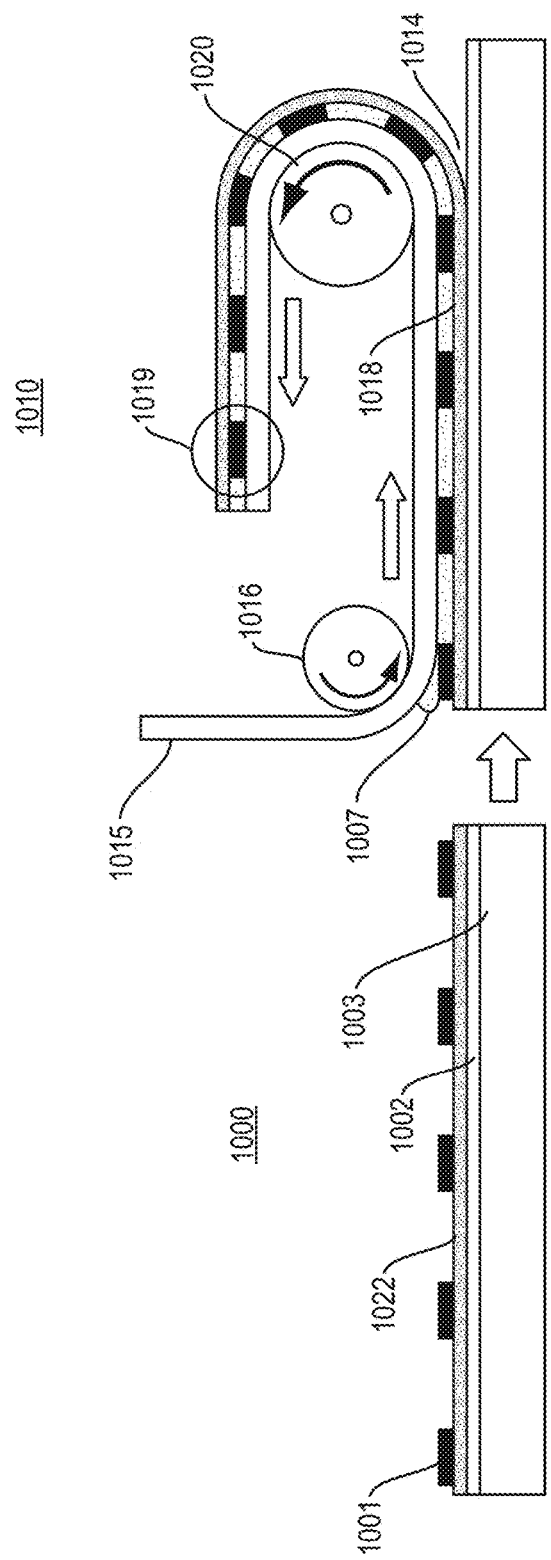
FIG. 10 shows a process and apparatus for forming a planarized metal grid having a secondary conductor.

Another R2R embodiment of the method shown in FIG. 9 is given in FIG. 10, which provides an additional planarized field conductor over the buried metal grid elements of the previous example. Donor substrate 1000 comprises, in sequence, metal pattern element 1001, field conductor 1022, release layer 1002, and substrate 1003. In sketch 1010, receiver substrate 1015 is fed off a supply spool (not shown) and is laminated to donor substrate 1000 by the action of pressure nip 1016 with adhesive 1007, similar to the corresponding component of FIG. 9. The embodiment in sketch 1010 includes an extended contact area to allow curing of slower-cure adhesives. Wrapping of solidified layer (adhesive and embedded materials) around delamination nip roll 1020 causes metal 1001, field conductor 1022 and cured adhesive 1018 to separate at release layer 1002 and travel to a rewind spool (not shown). As with area 909 in FIG. 9, area 1019 shows field conductor 1022 conformal to the metal grid elements and, similarly, has an outer surface that replicates the smoothness (or relief pattern) of the underlying substrate.

Figure 11:
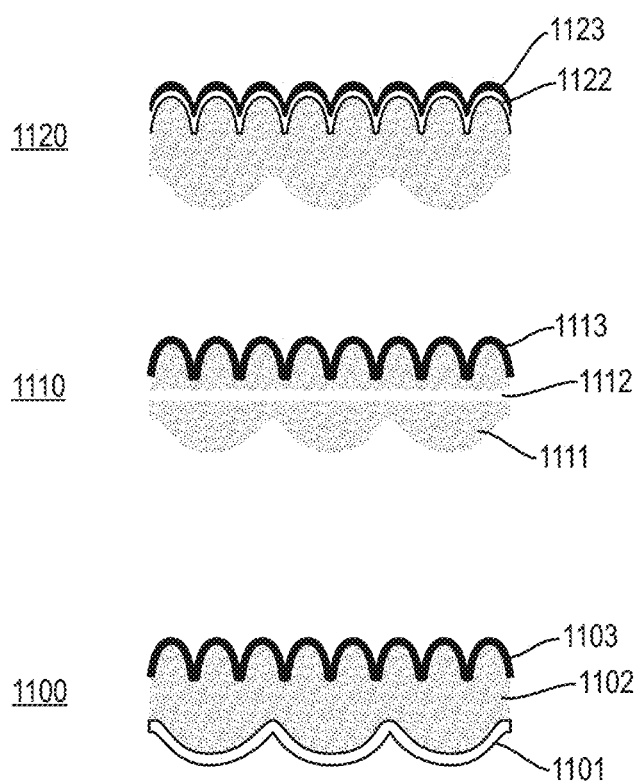
FIG. 11 shows in cross-section three alternative (or complementary) methods and apparatus for incorporating barrier layers into light extraction substrates.

FIG. 11 illustrates several options for incorporating a barrier coating into the integrated substrate of this disclosure. Structure 1100 shows barrier layer 1101 deposited over the external light extraction structure of dual patterned substrate 1102. Conductive layer 1103 is conformal with the internal extraction layer. In structure 1110 barrier layer 1112 is between the internal and external extraction layers 1111 and 1113, respectively. In this case, the barrier could be formed as part of the film that contains layer 1111 or the film that contains layer 1113, or it could be a part of a separate film laminated between separate external and the internal extraction films. In structure 1120, barrier layer 1122 in formed over the internal extraction structure and is overcoated by conformal metal layer 1123. If additional barrier properties are required, barrier layers can be simultaneously included multiple of these locations.

Figure 12:
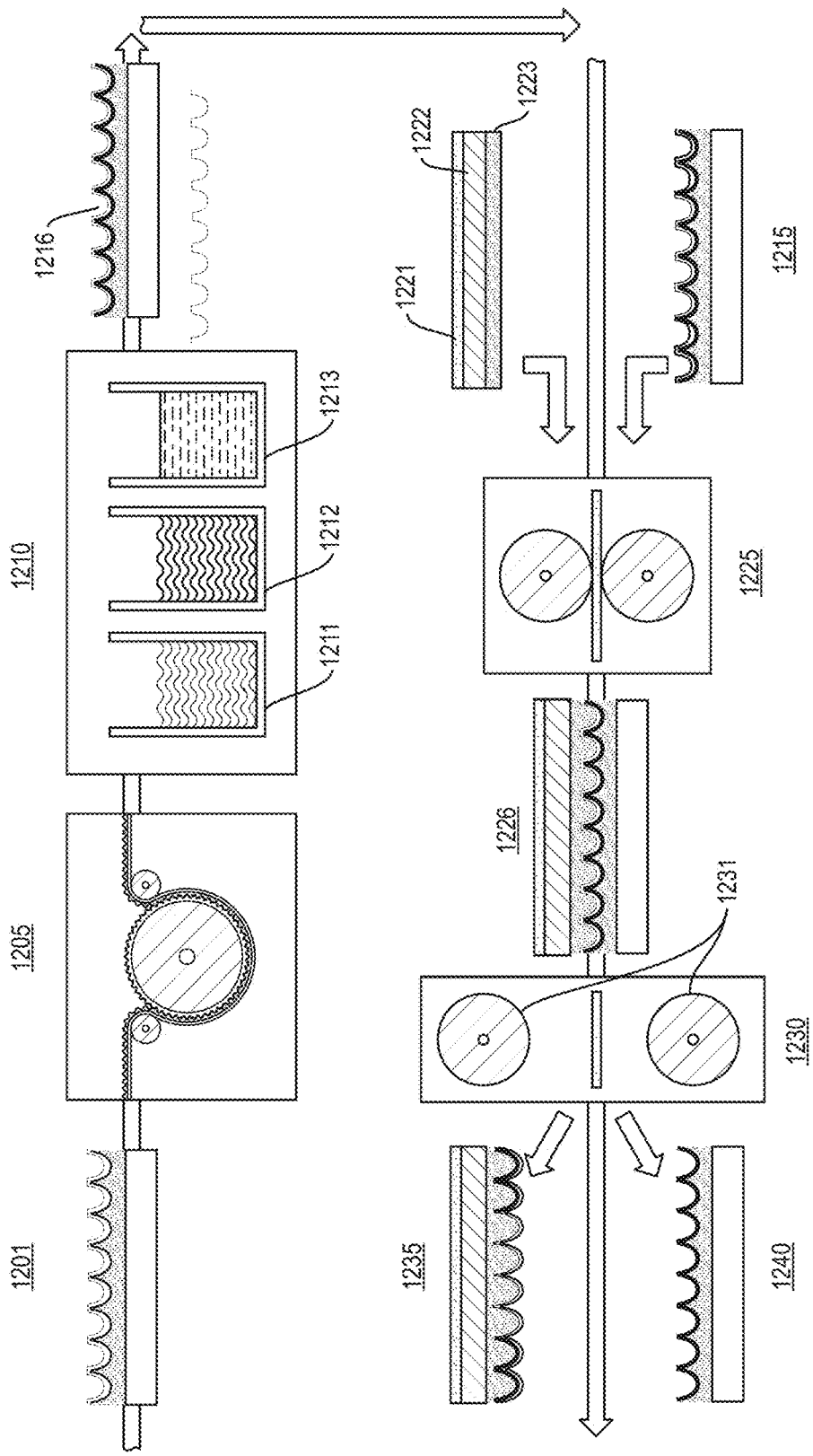
FIG. 12 is a flow diagram showing a method and apparatus for forming an internal light extraction substrate with conformal metal grid and secondary conductor.

FIG. 12 illustrates a R2R process flow for one embodiment of the present disclosure by which a substrate with an internal extraction pattern, conformal conductive grid with overlying field conductor may be formed using the transfer process. To start, substrate 1201, which is structurally equivalent to structure 705 of FIG. 7 having a relief patterned surface, a release coat, a field conductor and a metallic conductive layer, travels in the direction of the arrow into mask forming station 1205 in which a polymer mask is formed by any of the methods previously described. After exiting 1205, the film travels into station 1210, which comprises in this example 3 baths, a first solvent rinse bath 1211 for removing uncured polymer, a second wet (chemical) etch bath 1212 which contains an etchant formulation formulated to remove the conductive material under the polymer mask. The chemistry, concentration, temperature and dwell time in the bath are adjusted to optimize the etch process so that optimal pattern formation is achieved. The third bath, 1213, is a neutralization and rinse bath which quenches the etch reaction and washes off residual chemistry. After drying the substrate, it exits processing station 1210, at which point structure 1215 is produced, with 1216 indicating where the metal layers has been selectively removed through the mask (here the mask is not shown for simplicity).

In a next step for this embodiment, substrate 1222 with barrier layer 1221 on its outer surface is bonded to structure 1215 with adhesive 1223 in pressure nip station 1225. A UV curable adhesive may be advantageously used here due to its very fast cure time. Laminated structure 1230 exits station 1225 as structure 1226, which then travels into delamination station 1230 where the laminate is separated into structure 1240 (equivalent to 701 of FIG. 7) and structure 1235 (equivalent to 716 of FIG. 7). Note that substrate 1240 can be recoated with a field conductor and metal for re-use as structure 1201.

Figure 13:
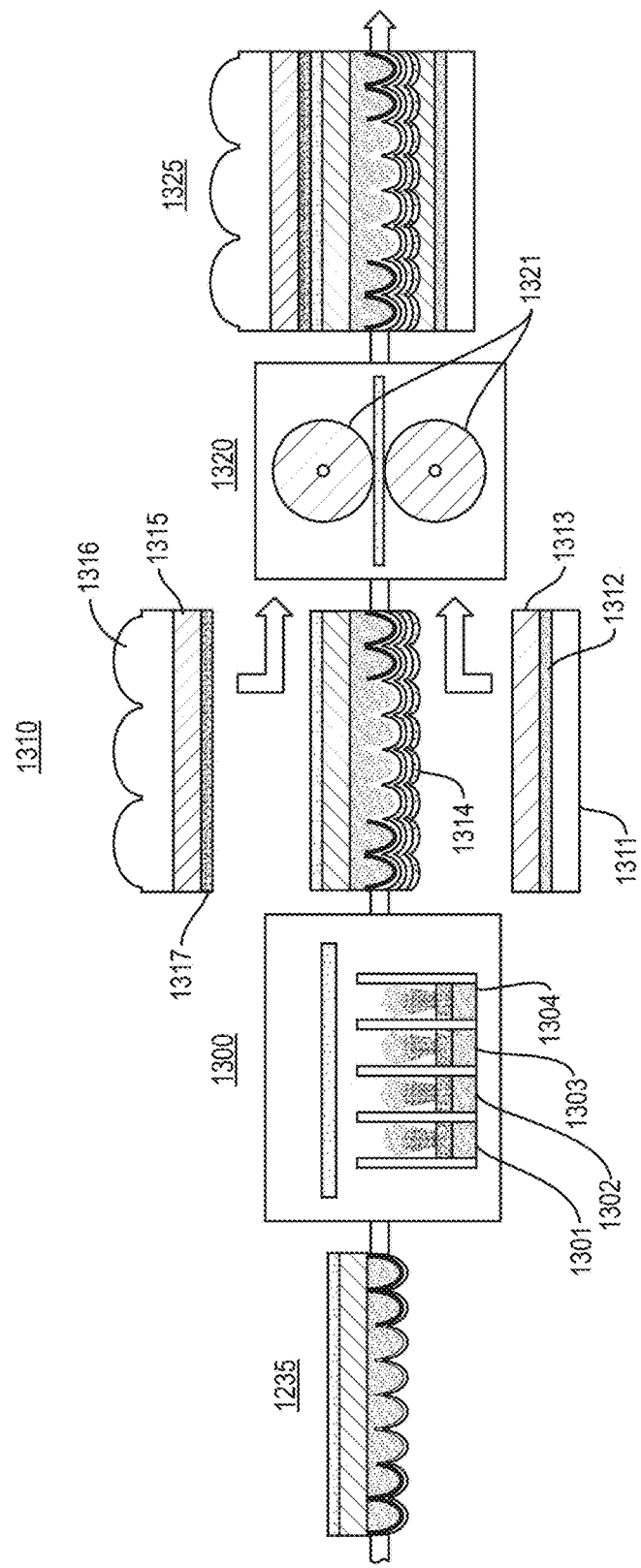
FIG. 13 is a flow diagram showing a method and apparatus for forming OLED devices on a light extracting substrate with a metal grid transparent conductor.

FIG. 13 illustrates one R2R method by which an enhanced substrate formed by one of the methods of the present disclosure can be used as the working substrate for deposition of an electronic device, in this example an OLED. Here structure 1235 is fed into coating chamber 1300 in which the multiple thin-film layers that comprise an OLED device are deposited by means known to the art. Such a stack may be comprised of such elements as hole injection layer (HIL) 1301, various organic emitters 1302, 1303, electron transport layer (ETL) 1304, and a cathode metal (not shown). After the coated structure exits station 1300, it enters station 1315 where an external light extraction layer is bonded to the emitting side of 1235. The extraction layer comprises support film 1315, relief structure 1316, and adhesive layer 1317. Bonded to the other side of 1235 is a backside barrier material, which in this example is a thin metal foil, such as stainless steel or aluminum. For a transparent device, this could be glass or a plastic barrier film, such as described in previous examples. The backside material is bonded using an appropriate encapsulant with barrier properties, producing final structure 1325.

Although the enhanced substrate fabrication process in this embodiment is R2R, the OLED stack deposition can be done either as a R2R or batch process. If the latter, then structure 1235 can be cut into panels for processing. If stack deposition is R2R, then the individual devices are cut from the film, either by die, laser or other known methods. Finally, the edges of the final device are also sealed with a barrier encapsulant or encapsulants (not shown). In order to minimize exposure to oxygen and moisture, steps 1300, 1310 and 1320 and edge sealing may be carried out in an inert atmosphere.

Figure 14A:
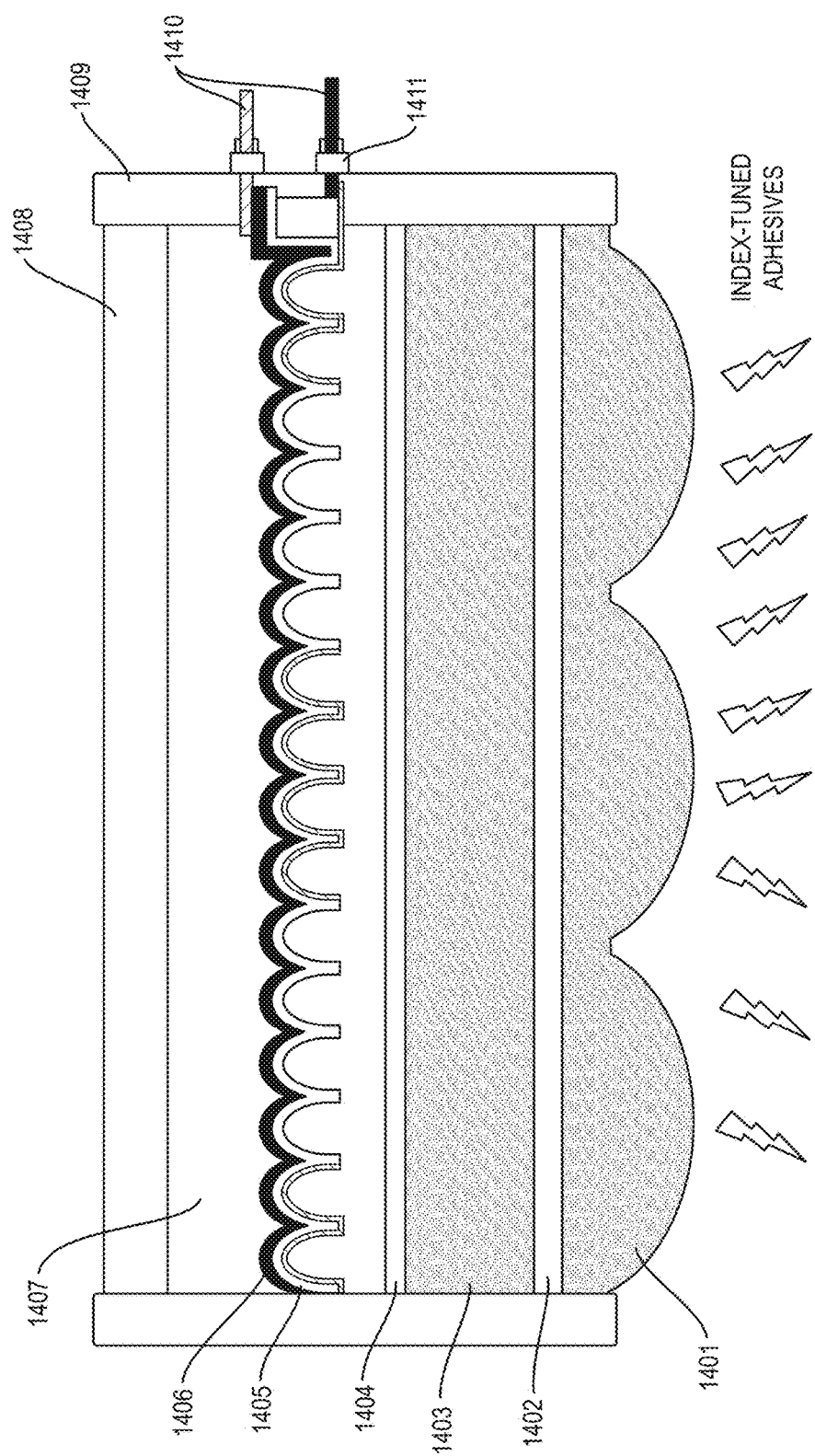
FIG. 14A shows a cross-section of an OLED device deposited onto a substrate incorporating light extraction, transparent metal grid, and barrier layers.

Two of many possible configurations many by the methods of the present disclosure are shown in FIGS. 14A and 14B. The cross-sectional sketch (not to scale) in FIG. 14A shows an OLED device having external light extraction structure 1401, bonding adhesive 1402, transparent substrate 1403, barrier layer 1404, metal grid+field conductor 1405 conformal to relief pattern, conformal OLED stack 1406, encapsulants adhesive 1407, backside barrier film 1408, edge seal 1409, and external electrical contact bus 1410 with seal 1411.

FIG. 14B represents another embodiment of the present disclosure in which the internal and external light extraction relief structures are formed on a single substrate 1422, such as shown in FIGS. 1A, 1B and 11. The barrier coating 1421 in this illustrative example is on the external extraction surface, although it could also have been formed over the internal relief structure. The conformal metal+field conductor structure 1423 is now conformally coated with OLED stack 1424, which in turn is embedded in encapsulate adhesive 1425 attached to top barrier 1428, in this case being a transparent material such as glass or plastic barrier film. Edge seal 1429 with electrical connections 1430 and seal 1431 complete the structure.

EXEMPLARY EMBODIMENTS

Clause 1

A substrate for controlling optical and/or electrical properties of electronic devices deposited thereupon, the substrate including (but not necessarily in the listed order):
  a first surface having a fine undulating relief structure capable of directing light,
  a release layer conformal with the fine undulating relief structure,
  an electrically conductive grid pattern conformal with the continuous transparent electrically conductive layer,
  a continuous transparent electrically conductive layer conformal with the release layer,
  one or more material layers having oxygen and moisture barrier properties, and
  a patterned relief surface on the opposite side of the substrate capable of directing light.

Clause 2

The substrate of clause 1 in which the electrically conductive grid is embedded into, and conformal with, the fine undulating surface relief pattern so as to exhibit no protrusions from the relief pattern.

Clause 3

The substrate of clause 2 in which a second electrically conductive transparent layer continuously and conformally covers the embedded electrically conductive grid.

Clause 4

The substrate of clause 1 in which the fine undulating surface relief pattern is imprinted directly into the surface of the substrate Clause 5

The substrate of clause 1 wherein the fine undulating surface relief pattern is formed as a separate imprinted layer upon the substrate.

Clause 6

The substrate of clause 5 in which the layer including the fine undulating surface relief pattern has a refractive index intermediate that of the underlying substrate and an overlying material layer.

Clause 7

The substrate of clause 1 in which the substrate includes two or more bonded substrates.

Clause 8

The substrate of clause 1 in which the composition of the substrate includes one or more of plastic, glass or ceramic materials.

Clause 9

The substrate of clause 1 in which the wires including the electrically conductive grid are randomly dithered so as to reduce or eliminate the effects of optical diffraction.

Clause 10

A method for providing a substrate for controlling optical and/or electrical properties of electronic devices deposited thereupon, the method including:
  forming a first fine undulating surface on a polymeric film,
  conformally depositing a releasable layer onto the first fine undulating surface,
  conformally depositing a first continuous transparent electrically conductive layer onto the releasable layer,
  conformally depositing a second electrically conductive layer onto the first conductive layer,
  forming a polymer mask having open areas on the second conductive layer,
  forming an electrically conductive grid pattern by selective removal of material from the second conductive layer through the open areas of the polymer mask,
  forming a laminate by adhesively bonding a second film to the polymer mask layer,
  separating the laminate at the releasable layer to form on the second substrate a continuous conformal transparent conductive layer overlying a conformal patterned conductive layer, in turn overlying the fine undulating surface.

Clause 11

The method of clause 10 wherein the first continuous transparent electrically conductive layer is composed of one or more of transparent conductive oxides, conductive nanostructures, conductive organic materials.

Clause 12

The method of clause 10 wherein the second electrically conductive layer is a metal.

Clause 13

The method of clause 10 wherein the polymer mask is formed between the photomask and the substrate by the action of curing radiation transmitted through the photomask.

Clause 14

The method of clause 13 wherein the photomask is protected from contact with the radiation curable material layer by the interposition of a thin polymeric film between the photomask and the light curable material.

Clause 15

The method of clause 10 wherein the polymeric mask is formed by selective exposure of a radiation-curable material through a photomask having opaque areas which are proud relative to the transparent areas of the photomask.

Clause 16

The method of clause 15 wherein the polymeric mask is formed by exposure of a radiation-curable material through a photomask having transparent areas, corresponding to otherwise opaque photomask areas, which are proud relative to the transparent areas of the photomask.

Clause 17

The method of clause 13 wherein the level of radiation flux passing through a given size aperture of the photomask is adjusted for optimal curing level of the curable polymer layer for the aperture.

Clause 18

The method of clause 17 wherein the adjustment is carried out using a density mask with apertures corresponding to those of the photomask, where the density of each corresponding aperture of the density mask is adjusted to simultaneously provide optimum exposure flux for each aperture area of the photomask.

Clause 19

The method of clause 10 wherein residual uncured radiation-curable material is removed by solvent cleaning.

Clause 20

The method of clause 10 in which the electrically conductive grid pattern is formed by selectively removing conductive material from the open areas of the polymer mask by one or more of the removal means of plasma or chemical etching.

Clause 21

The method of clause 10 in which the electrically conductive grid pattern includes areas to facilitate electrical contact to the grid pattern.

Clause 22

The method of clause 10 wherein the substrates includes one or more of plastic, glass or ceramic materials.

Clause 23

The method of clause 22 wherein the substrate is polycarbonate.

The following clauses cover the method for making substrate without transfer.

Clause 24

A method for providing a substrate for controlling optical and/or electrical properties of electronic devices deposited thereupon, the method including
  forming a polymeric undulating fine relief surface on the substrate,
  conformally forming an electrically conductive layer onto the relief surface,
  forming a polymer mask having open areas on the conductive layer,
  forming an electrically conductive grid pattern in the electrically conductive layer conformal to the relief pattern by selective removal of material from the electrically conductive layer through the open areas of the polymer mask,
  removing the polymer mask,
  conformally depositing a second continuous transparent electrically conductive layer onto the electrically conductive grid pattern.
  incorporating one or more material layers having oxygen and moisture barrier properties,
  incorporating a patterned relief surface on the opposite side of the substrate capable of directing light.

Clause 25

The method of clause 24 wherein the electrically conductive layer is a metal layer.

Clause 26

The method of clause 24 wherein the transparent conductive layer is composed of one or more of transparent conductive oxides, conductive nanostructures, conductive organic materials.

Clause 27

The method of clause 24 wherein the polymer mask is formed between the photomask and the substrate by the action of curing radiation transmitted through the photomask.

Clause 28

The method of clause 24 wherein residual uncured material used to form the polymer mask is removed by solvent cleaning.

Clause 29

The method of clause 24 wherein the electrically conductive grid pattern is formed by selectively removing conductive material from the open areas of the polymer mask by one or more of the removal means of plasma or wet etching.

Clause 30

The method of clause 29 wherein the electrically conductive grid pattern includes areas for facilitating electrical contact to the grid pattern.

Clause 31

The method of clause 24 wherein the polymer mask is removed by one or more of chemical or mechanical or plasma etch removal means.

Clause 32

The method of clause 24 wherein the substrates includes one or more of plastic, glass or ceramic materials, Clause 33

The method of clause 32 wherein the substrate is polycarbonate.

Clause 34

The method of clause 24 wherein the opposite side of the substrate includes a patterned relief surface capable of directing light.

Clause 35

The method of clause 24 wherein the undulating fine relief surface is formed from a master template made by laser interferometry so as to have smoothly undulating features without abrupt edges Clause 36

The methods of clauses 10 and/or 24 wherein the structures are formed by a sequence of process steps that include one or more roll-to-roll process steps.

Clause 37

The method of clause 36 wherein one of the roll-to-roll process steps includes using a rotary photomask to form a polymer mask on a substrate having a fine undulating relief structure.

Clause 38

The method of clause 36 wherein the rotary mask includes opaque areas which are proud relative to the transparent areas of the photomask.

Clause 39

The method of clause 36 wherein the rotary mask includes transparent areas, corresponding to otherwise opaque photomask areas, which are proud relative to the transparent areas of the photomask.

Clause 40

The method of clause 36 wherein the rotary photomask includes a density mask to adjust the radiation flux through the rotary photomask.

Unless otherwise indicated, the methods, apparatus, and/or systems that have been discussed herein can be implemented, controlled, and/or designed with a specially-configured computer system specifically configured to perform the functions that have been described herein for the component. Each computer system includes one or more processors, tangible memories (e.g., random access memories (RAMs), read-only memories (ROMs), and/or programmable read only memories (PROMS)), tangible storage devices (e.g., hard disk drives, CD/DVD drives, and/or flash memories), system buses, video processing components, network communication components, input/output ports, and/or user interface devices (e.g., keyboards, pointing devices, displays, microphones, sound reproduction systems, and/or touch screens).

Each computer system may be a desktop computer or a portable computer, such as a laptop computer, a notebook computer, a tablet computer, a PDA, a smartphone, or part of a larger system, such a vehicle, appliance, and/or telephone system. Each computer system for the implementation, control, and/or design of embodiments of the present disclosure may include one or more computers at the same or different locations. When at different locations, the computers may be configured to communicate with one another through a wired and/or wireless network communication system.

Each computer system may include software (e.g., one or more operating systems, device drivers, application programs, and/or communication programs). When software is included, the software includes programming instructions and may include associated data and libraries. When included, the programming instructions are configured to implement one or more algorithms that implement one or more of the functions of the computer system, as recited herein. The description of each function that is performed by each computer system also constitutes a description of the algorithm(s) that performs that function.

The software may be stored on or in one or more non-transitory, tangible storage devices, such as one or more hard disk drives, CDs, DVDs, and/or flash memories. The software may be in source code and/or object code format. Associated data may be stored in any type of volatile and/or non-volatile memory. The software may be loaded into a non-transitory memory and executed by one or more processors.

The components, steps, features, objects, benefits, and advantages that have been discussed are merely illustrative. None of them, or the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. A substrate for controlling optical and/or electrical properties of electronic devices deposited thereupon, the substrate comprising:
   a. a first surface having a fine undulating relief structure capable of directing light;
   b. a release layer conformal with the fine undulating relief structure;
   c. an electrically conductive grid pattern conformal with the continuous transparent electrically conductive layer;
   d. a continuous transparent electrically conductive layer conformal with the release layer;
   e. one or more material layers having oxygen and moisture barrier properties; and
   f. a patterned relief surface on the opposite side of the substrate capable of directing light.

2. The substrate of claim 1 in which the electrically conductive grid is embedded into, and conformal with, the fine undulating surface relief pattern so as to exhibit no protrusions from the relief pattern.

3. The substrate of claim 2 in which a second electrically conductive transparent layer continuously and conformally covers the embedded electrically conductive grid.

4. The substrate of claim 1 in which the fine undulating surface relief pattern is imprinted directly into the surface of the substrate.

5. The substrate of claim 1 wherein the fine undulating surface relief pattern is formed as a separate imprinted layer upon the substrate.

6. The substrate of claim 5 in which the layer comprising the fine undulating surface relief pattern has a refractive index intermediate that of the underlying substrate and an overlying material layer.

7. The substrate of claim 1 in which the substrate comprises two or more bonded substrates.

8. The substrate of claim 1 in which the composition of the substrate includes one or more of plastic, glass or ceramic materials.

9. The substrate of claim 1 in which the wires comprising the electrically conductive grid are randomly dithered so as to reduce or eliminate the effects of optical diffraction.

10. A method for providing a substrate for controlling optical and/or electrical properties of electronic devices deposited thereupon, the method comprising:
    a. forming a first fine undulating surface on a polymeric film;
    b. conformally depositing a releasable layer onto the first fine undulating surface;
    c. conformally depositing a first continuous transparent electrically conductive layer onto the releasable layer;
    d. conformally depositing a second electrically conductive layer onto the first conductive layer;
    e. forming a polymer mask having open areas on the second conductive layer;
    f. forming an electrically conductive grid pattern by selective removal of material from the second conductive layer through the open areas of the polymer mask;
    g. forming a laminate by adhesively bonding a second film to the polymer mask layer; and
    h. separating the laminate at the releasable layer to form on the second substrate a continuous conformal transparent conductive layer overlying a conformal patterned conductive layer, in turn overlying the fine undulating surface.

11. The method of claim 10 wherein the first continuous transparent electrically conductive layer is composed of one or more of transparent conductive oxides, conductive nanostructures, conductive organic materials.

12. The method of claim 10 wherein the second electrically conductive layer is a metal.

13. The method of claim 10 wherein the polymer mask is formed between the photomask and the substrate by the action of curing radiation transmitted through the photomask.

14. The method of claim 13 wherein the photomask is protected from contact with the radiation curable material layer by the interposition of a thin polymeric film between the photomask and the light curable material.

15. The method of claim 10 wherein the polymeric mask is formed by selective exposure of a radiation-curable material through a photomask having opaque areas which are proud relative to the transparent areas of the photomask.

16. The method of claim 15 wherein the polymeric mask is formed by exposure of a radiation-curable material through a photomask having transparent areas, corresponding to otherwise opaque photomask areas, which are proud relative to the transparent areas of the photomask.

17. The method of claim 13 wherein the level of radiation flux passing through a given size aperture of the photomask is adjusted for optimal curing level of the curable polymer layer for the aperture.

18. The method of claim 17 wherein the adjustment is carried out using a density mask with apertures corresponding to those of the photomask, where the density of each corresponding aperture of the density mask is adjusted to simultaneously provide optimum exposure flux for each aperture area of the photomask.

19. The method of claim 10 wherein residual uncured radiation-curable material is removed by solvent cleaning.

20. The method of claim 10 in which the electrically conductive grid pattern is formed by selectively removing conductive material from the open areas of the polymer mask by one or more of the removal means of plasma or chemical etching.

21. The method of claim 10 in which the electrically conductive grid pattern includes areas to facilitate electrical contact to the grid pattern.

22. The method of claim 10 wherein the substrates includes one or more of plastic, glass or ceramic materials.

23. The method of claim 22 wherein the substrate is polycarbonate.

\* \* \* \* \*